United States Patent [19]

Takahashi

[11] Patent Number: 5,569,941
[45] Date of Patent: Oct. 29, 1996

[54] INSULATED GATE SEMICONDUCTOR DEVICE WITH A BURIED GAPPED SEMICONDUCTOR REGION

[75] Inventor: Hideki Takahashi, Fukuoka, Japan

[73] Assignee: Mitsubishi Denki Kabushiki Kaisha, Tokyo, Japan

[21] Appl. No.: 441,787

[22] Filed: May 16, 1995

Related U.S. Application Data

[63] Continuation of Ser. No. 135,471, Oct. 13, 1993, abandoned.

[30] Foreign Application Priority Data

Oct. 20, 1992 [JP] Japan .................................. 4-281664
Sep. 21, 1993 [JP] Japan .................................. 5-234992

[51] Int. Cl.$^6$ ......................... H01L 29/74; H01L 31/111; H01L 29/76; H01L 29/94
[52] U.S. Cl. ..................... 257/133; 257/132; 257/153; 257/163; 257/331; 257/332; 257/336; 257/341
[58] Field of Search ..................... 257/132, 133, 257/146, 153, 163, 330, 331, 332, 335, 336, 337, 341, 342

[56] References Cited

U.S. PATENT DOCUMENTS

| | | | |
|---|---|---|---|
| 4,985,741 | 1/1991 | Bauer et al. | 257/133 |
| 5,093,701 | 3/1992 | Nakagawa et al. | 257/341 |
| 5,136,349 | 8/1992 | Yilmaz et al. | 257/133 |
| 5,202,750 | 4/1993 | Gough | 257/133 |

FOREIGN PATENT DOCUMENTS

| | | |
|---|---|---|
| 0450082 | 10/1991 | European Pat. Off. . |
| 0503605 | 9/1992 | European Pat. Off. . |
| 4112905 | 10/1991 | Germany . |
| 61-216363 | 9/1986 | Japan .................................. 257/335 |
| 62-283669 | 12/1987 | Japan .................................. 257/341 |
| 63-288064 | 11/1988 | Japan .................................. 257/146 |
| 1-282872 | 11/1989 | Japan .................................. 257/335 |
| 4-72669 | 3/1992 | Japan . |

OTHER PUBLICATIONS

Patent Abstracts of Japan, vol. 14, No. 139, Mar. 15, 1990, JP-A-2003288, Jan. 8, 1990.
Patent Abstracts of Japan, vol. 11, No. 55 (E-481) [2502], Feb. 20, 1987, and JP-A-61-216363, Sep. 26, 1986.

*Primary Examiner*—Ngân V. Ngô
*Attorney, Agent, or Firm*—Oblon, Spivak, McClelland, Maier & Neustadt, P.C.

[57] ABSTRACT

A heavily doped n-type semiconductor region is selectively formed at a surface where a p-type semiconductor layer and an n-type semiconductor layer abut each other. Injection of holes from the p-type semiconductor layer to the n-type semiconductor layer is attained by holes which selectively flow in a region where the heavily doped n-type semiconductor region is not present. The high concentration of the holes at such a region exerts a predominant influence in the device when a collector current is small, whereby flow of the collector current is facilitated and the ON-resistance of the device is suppressed. On the other hand, when the collector current is large, under a dominantly strong influence of a fact that flow of the collector current is allowed only through the region where the heavily doped n-type semiconductor region is not provided, the flow of the collector current is suppressed, and hence, the durability against destruction of the device is enhanced. A low ON-resistance and an improved durability against destruction are achieved at the same time.

16 Claims, 21 Drawing Sheets

INSULATED GATE SEMICONDUCTOR DEVICE WITH A BURIED GAPPED SEMICONDUCTOR REGION

This application is a Continuation of application Ser. No. 08/135,471, filed on Oct. 13, 1993, now abandoned.

BACKGROUND OF THE INVENTION

1. Field of the Invention

The present invention relates to an insulated gate semiconductor device such as an insulated gate bipolar transistor (hereinafter abbreviated as "IGBT") and a method of manufacturing the same.

2. Description of the Prior Art

An insulated gate bipolar transistor is a semiconductor device which has a structure in which p-type semiconductor regions and n-type semiconductor regions are joined so that at least four semiconductor regions of alternate conductivity type are disposed in series. The two outer semiconductor regions, at least, are electrically connected to a positive and a negative main electrodes, respectively. To one of the two inner semiconductor regions, a gate electrode for applying an electric field is connected through an insulating thin film. In this type of semiconductor device, a current which flows between the two main electrodes changes in accordance with a voltage which is applied to the gate electrode. An IGBT, an EST (Emitter Switched Thyristor), a MCT (MOS Controlled Thyristor) and the like fall within this category of semiconductor device.

<Structure of Conventional Device>

FIG. 20 is a cross sectional view showing the structure of a conventional N-channel type IGBT. In general, an IGBT is comprised of a number of IGBT elements (hereinafter "unit cells") which are connected parallel to each other. FIG. 20 shows a cross section of one unit cell. In this IGBT, an n-type semiconductor layer 11 is formed on a p-type semiconductor layer 1 which includes a p-type semiconductor substrate, whereby a semiconductor substrate body 12 is formed. Locally in the top major surface of the n-type semiconductor layer 11, i.e., in the top major surface of the semiconductor substrate body 12, a p-type base region 4 is formed by selective diffusion of p-type impurities. Also locally in the top major surface of the semiconductor substrate body 12, an n-type emitter region 5 is formed by selective diffusion of n-type impurities. On top surface of the p-type base region 4 between the top surface of the n-type semiconductor layer 11 and the top major surface of the n-type emitter region 5, a gate insulation film 7 is disposed. On the gate insulation film 7, a gate electrode 8 which is made of polycrystalline silicon (hereinafter simply as "polysilicon") is formed.

An emitter electrode 9 made of aluminum is disposed in electrical connection to both the p-type base region 4 and the n-type emitter region 5. The gate electrode 8 and the emitter electrode 9 are insulated from each other. The gate electrodes 8 of the respective unit cells are electrically connected with each other and the emitter electrodes 9 of the respective unit cells are also electrically connected with each other. A collector electrode 10 which is made of metal such as aluminum is electrically connected to the bottom major surface of the p-type semiconductor layer 1. The collector electrodes 10 of the respective unit cells are contiguous with each other.

The n-type semiconductor layer 11 includes a buffer layer 2 which is heavily doped n-type where it abuts the p-type semiconductor layer 1. In the class of IGBT having withstand voltage of 600 V, within the n-type semiconductor layer 11, the n-type semiconductor layer 3 excluding the buffer layer 2 has an impurity concentration of about $10^{14}$ $cm^{-3}$ (In general, the withstand voltage becomes higher in proportion to decrease of the impurity concentration. The following description will be made for the IGBT having a withstand voltage class of 600 V.) In the buffer layer 2, on the other hand, the concentration of n-type impurities is about $10^{17}$ $cm^{-3}$.

<Operations of Conventional Device>

Now, the operation of the conventional device will be explained. First, a predetermined collector voltage $V_{CE}$ is applied between the emitter electrode 9 and the collector electrode 10. If in addition to this, a gate voltage $V_{GE}$ exceeding a threshold value which the device inherently has is applied between the emitter electrode 9 and the gate electrode 8, the p-type base region 4 is inverted into the n-type at a channel region 6 which is located in the vicinity of the gate electrode 8, thereby creating an n-type channel at the channel region 6. Through this channel, carriers, in this case electrons, are introduced from the emitter electrode 9 into the n-type semiconductor layer 3. Due to the introduced electrons, a forward bias is applied between the p-type semiconductor layer 1 and the n-type semiconductor layer 11, causing injection of carriers, i.e., holes in this case, from the p-type semiconductor layer 1. As a result, the resistance of the p-type semiconductor layer 1 drops largely so that a collector current $I_c$ flowing from the collector electrode 10 to the emitter electrode 9 drastically increases. In other words, the device turns conductive (i.e., turns on). A resistance against the collector current $I_c$ at such an occasion is called an ON-resistance. The ON-resistance is in most cases expressed as the collector voltage $V_{CE}$ when the collector current $I_c$ is equal to a normal rated current value (i.e., saturation collector voltage $V_{CE}(sat)$). The normal rated current of the conventional IGBT is typically around 50 to 150 $A/cm^2$. Thus, in the IGBT, the resistance of the n-type semiconductor layer 11 is reduced by means of injection of holes from the p-type semiconductor layer 1.

FIG. 21 is a graph showing output characteristics of the device in response to various gate voltages $V_{GE}$. When the collector voltage $V_{CE}$ is increased while the gate voltage $V_{GE}$ of a certain value is applied, the flow rate of electrons flowing in the channel is suppressed by a certain amount which corresponds to the gate voltage $V_{GE}$. For this reason, the collector current $I_c$ flowing in the device saturates at a constant value which corresponds to the gate voltage $V_{GE}$, that is, at a saturation collector current $I_c(sat)$ (horizontal straight portions of the curves in FIG. 21).

The buffer layer 2 controls injection of holes from the p-type semiconductor layer 1. In the buffer layer 2, due to a high concentration of the n-type impurities, holes from the p-type semiconductor layer 1 easily combine with electrons which exist in the buffer layer 2. Hence, provision of the buffer layer 2 lowers the saturation collector current $I_c(sat)$ while enhances the ON-resistance. By adjusting the thickness and the impurity concentration of the buffer layer 2, the saturation collector current $I_c(sat)$ and the ON-resistance can be adjusted.

If the gate voltage $V_{GE}$ is suppressed under the threshold value while keep applying the collector voltage $V_{CE}$ of a predetermined value, an n-channel would not be created and no collector current $I_c$ would be initiated. That is, the IGBT is cut off (i.e., turns off). When the collector voltage $V_{CE}$ is increased under OFF-state of the device by means of a reduction in the gate voltage $V_{GE}$ to zero or other suitable method, the collector current $I_c$ would not be started until the collector voltage $V_{CE}$ reaches a certain value. However, once the collector voltage $V_{CE}$ has grown beyond the certain value, the collector current $I_c$ will start flowing and become increasingly large. The collector voltage $V_{CE}$ at this stage is referred to as "breakdown voltage." The collector voltage $V_{CE}$ which can be applied to the IGBT is less than the breakdown voltage.

When the collector voltage $V_{CE}$ as large as about the breakdown voltage is applied to the IGBT, a depiction layer grows from the p-type base region 4 to as far as the buffer layer 2. If the depiction layer reaches the p-type semiconductor layer 1, the IGBT turns conductive from the p-type semiconductor layer 1 to the p-type base region 4 (known as "punch through"). The buffer layer 2, preventing growth of the depletion layer into the p-type semiconductor layer 1, obviates punch through.

<Problems of Conventional Device>

As can be readily understood from the device structure of the IGBT shown in FIG. 20, the IGBT includes a parasitic thyristor which is formed by the n-type emitter region 5, the n-type semiconductor layer 11 and the p-type semiconductor layer 1. The parasitic thyristor turns on if the collector current $I_c$ exceeds a certain value (i.e., latch up current) (Ts is known as "latching up of the IGBT"). Once the parasitic thyristor has turned on, no matter how the gate voltage $V_{GE}$ is controlled, it is impossible to control the collector current $I_c$. The collector current $I_c$ then keeps flowing, eventually destroying the IGBT.

If the buffer layer 2 is formed having a thickness which would allow injection of holes from the p-type semiconductor layer 1 in a great number in order to reduce the ON-resistance, the value of the saturation collector current $I_c(sat)$ which is developed in response to application of a certain gate voltage $V_{GE}$ would increase. If the saturation collector current $I_c(sat)$ is large, the collector current $I_c$ tends to exceed the latch up current during the operations of the IGBT. The result of this is an increased possibility of destruction of the IGBT due to latch up.

Besides, constructed as a switching element, in actual use, the IGBT occasionally turns conductive while a load is short circuited; that is, short circuiting is caused. When the IGBT short circuits, a current flowing in the IGBT is determined by the IGBT alone since there is no load any more which controls the collector current $I_c$. FIG. 22 is a graph showing the waveform of the collector current $I_c$ with a change in time after the short circuiting. Immediately after the short circuiting, the collector current $I_c$ exhibits an abrupt increase, amounting to a maximum value which is about 5 to 20 times as large as the normal rated current value (50 to 150 A/cm²). It is when the collector current $I_c$ is at this maximum level that the IGBT is most likely to be destroyed due to latch up.

After the collector current $I_c$ reached the maximum level, even if latch up has not occurred, a continued unusually large collector current $I_c$ far beyond a normal level under normal environment is still observed. Due to this, the IGBT will be destroyed after a certain time Tv. The time Tv, during which the IGBT remains undestroyed though short circuiting, must be longer than 10 to 20 µsec for practical reasons. In the art, it is a general knowledge that the lower the collector current $I_c$ is during short circuiting of the device, the longer the time Tv is. The collector current $I_c$ during short circuiting is defined at a value of the saturation collector current $I_c(sat)$.

If injection of an increased number of holes from the p-type semiconductor layer 1 is allowed by adjusting the buffer layer 2 to lower the ON-resistance as mentioned above, the value of the saturation collector current $I_c(sat)$ in response to application of a certain gate voltage $V_{GE}$ would increase. If the saturation collector current $I_c(sat)$ is large, the collector current $I_c$ under short circuiting becomes large, and therefore, the time Tv becomes short.

As heretofore described, the conventional IGBT has a drawback that a low ON-resistance easily causes destruction of the IGBT due to latch up and subsequent short circuiting (short-circuit destruction).

SUMMARY OF THE INVENTION

The present invention is directed to an insulated gate semiconductor device.

According to the present invention, the device comprises: a first semiconductor region of a first conductivity type; a second semiconductor region of a second conductivity type formed on the first semiconductor region; a third semiconductor region of the first conductivity type selectively formed in a top portion of the second semiconductor region; a fourth semiconductor region of the second conductivity type selectively formed in a top portion of the third semiconductor region; a fifth semiconductor region of the second conductivity type selectively formed in a bottom portion of the second semiconductor region and having a gap positioned at a desired position relative to the third and the fourth semiconductor regions and having a higher concentration of impurities of the second type than the second semiconductor region; an insulating layer formed on the third and the fourth semiconductor regions; a first main electrode electrically connected to the first semiconductor region; a second main electrode electrically connected to the fourth semiconductor region; and a control electrode formed on the insulating layer.

In the insulated gate semiconductor device according to the present invention, injection of carriers from the first semiconductor region to the second semiconductor region is attained by carriers which selectively flow in a region where the fifth semiconductor region is not present. As a result, when a current which flows between the first and the second main electrodes is small, under a predominant influence of a fact that the carrier concentration at such a region is higher than where the device does not comprise the fifth semiconductor region, flow of the current is facilitated. In other words, the ON-resistance of the device becomes lower than that where the fifth semiconductor region is not provided.

On the other hand, if the current is large, under a dominantly strong influence of a fact that flow of the current is allowed only through the region where the fifth semiconductor region is not provided, the flow of the current will be suppressed. Hence, the durability against destruction of the device is improved.

In an aspect of the present invention, the second semiconductor region comprises: a first semiconductor portion formed on the top major surface of the first semiconductor region and having a concentration of impurities of the second conductivity type which is lower than that of the fifth semiconductor region; and a second semiconductor portion formed on a top major surface of the first semiconductor portion and having a concentration of impurities of the second conductivity type which is lower than that of the first semiconductor portion.

During the device OFF-state, the first portion of the second semiconductor region prevents a depletion region which grows from the third semiconductor region from reaching the first semiconductor region. Hence, even if the second semiconductor region is thin, there is no possibility that punch through will be caused.

Preferably, the concentration of impurities of the second semiconductor portion is substantially equal to or less than $5 \times 10^{14}$ cm$^{-3}$, the concentration of impurities of the first semiconductor portion is selected from the range substantially defined from $5 \times 10^{14}$ cm$^{-3}$ to $10^{17}$ cm$^{-3}$, and the concentration of impurities of the fifth semiconductor region is selected from the range substantially defined from $10^{18}$ cm$^{-3}$ to $10^{21}$ cm$^{-3}$.

The impurity concentrations of the second conductivity type in the second, the fifth and the sixth semiconductor regions are optimized. Hence, a reduction in the ON-resistance and an improvement in the breakdown voltage are better achieved in the device.

The present invention is also directed to a method of manufacturing an insulated gate semiconductor device.

According to the present invention, the method comprises the steps of:

(a) obtaining a first semiconductor region of a first conductivity type; (b) obtaining, on a top major surface of the first semiconductor region, a structure in which a second semiconductor region of a second conductivity type is formed on the top major surface of the first semiconductor region and a third semiconductor region of a second conductivity type is selectively formed in a bottom portion of the second semiconductor region, wherein an impurity concentration of the third semiconductor region is higher than that of the second semiconductor region; (c) selectively forming a fourth semiconductor region of the first conductivity type in a top portion of the second semiconductor region, the fourth semiconductor region comprising first and second portions laterally separated from each other; (d) selectively forming a fifth semiconductor region of the second conductivity type in the fourth semiconductor region, the fifth semiconductor region comprising first and second portions selectively formed in the first and second portions of the fourth semiconductor region; (e) forming a first main electrode layer on a bottom major surface of the first semiconductor region; (f) forming a second main electrode layer on respective top major surfaces of said fourth and fifth semiconductor regions; and (g) forming an insulating layer which is in contact with the third semiconductor region in an area between the first and second portions of the fourth semiconductor region; and (h) forming a control electrode layer on the insulating layer.

The device according to the present invention may be manufactured in through the steps of: (a) obtaining a first semiconductor region of a first conductivity type; (b) obtaining, on a bottom major surface of the first semiconductor region, a structure in which a second semiconductor region of a second conductivity type is formed and a third semiconductor region of a first conductivity type is selectively formed in a top portion of the structure, wherein an impurity concentration of the third semiconductor region is higher than that of the first semiconductor region; (c) selectively forming a fourth semiconductor region of the second conductivity type in a top portion of the first semiconductor region; (d) selectively forming a fifth semiconductor region of the first conductivity type in the fourth semiconductor region; (e) forming a first main electrode layer on a bottom surface of the second semiconductor region; (f) forming a second main electrode layer on a top major surface of the fifth semiconductor region; (g) forming an insulating layer which is in contact with the fourth semiconductor region; and (h) forming a control electrode layer on the insulating layer.

Accordingly, it is an object of the present invention to obtain an insulated gate semiconductor device which has a low ON-resistance and an enhanced durability against destruction.

Another object of the present invention is to obtain a method of manufacturing such an insulated gate semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Preferred Embodiment>>
<Structure of Device>

Figure 1:
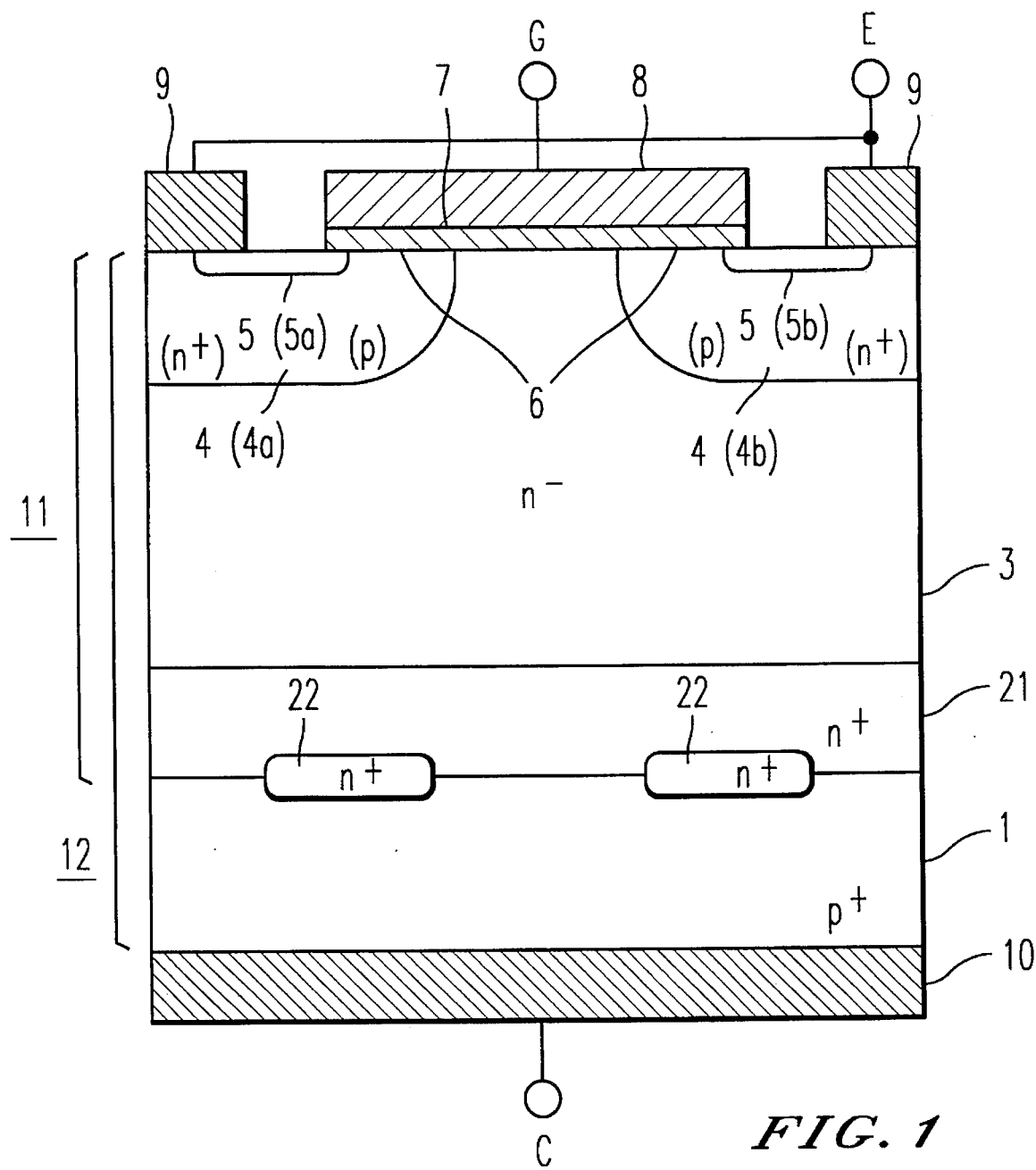
FIG. 1 is a cross sectional view showing the structure of an insulated gate semiconductor device according to a first preferred embodiment of the present invention.
Figure 20:
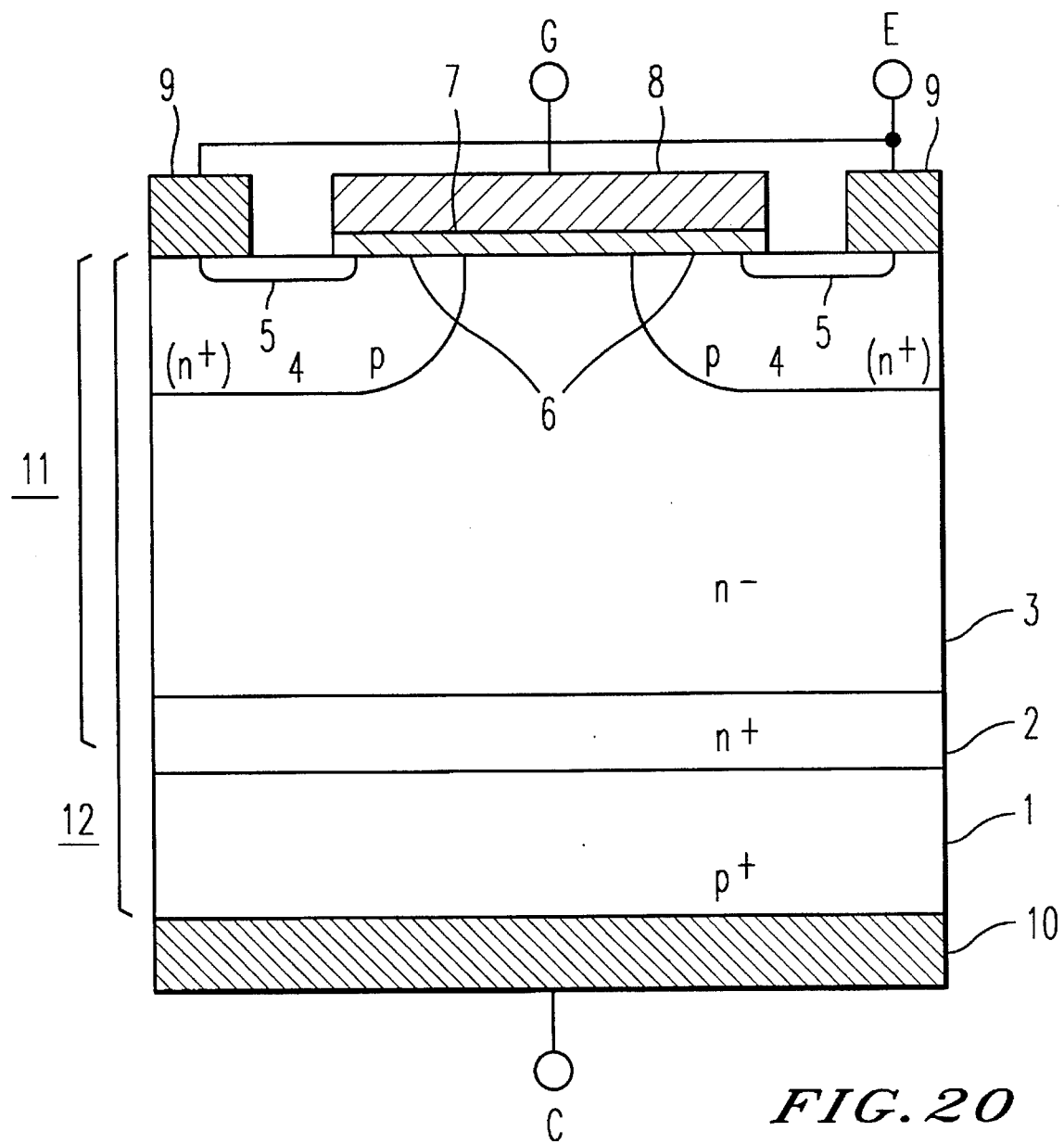
FIG. 20 is a cross sectional view showing the structure of a conventional insulated gate semiconductor device.

FIG. 1 is a cross sectional view showing the structure of an insulated gate semiconductor device according to a first preferred embodiment of the present invention. The illustrated device is an IGBT of a withstand voltage class of 600 V. Like the conventional IGBT shown in FIG. 20, the IGBT of the first preferred embodiment has a structure in which a number of unit cells are connected in parallel with each other. FIG. 1 shows a cross section of one unit cell. In the drawings hereinafter referred to, elements or parts corresponding to the same or equivalent elements are denoted by the same reference numerals.

In this IGBT, an n-type semiconductor layer 11 is formed on a p-type semiconductor layer 1 which includes a p-type semiconductor substrate, whereby a semiconductor substrate body 12 is formed. Locally in the top major surface of the n-type semiconductor layer 11, i.e., in the top major surface of the semiconductor substrate body 12, a p-type base region 4 is formed by selective diffusion of p-type impurities. The base region 4 comprises first and second portions 4a and 4b in the section illustrated in FIG. 1, portions 4a and 4b being separated from each other. Further, in the top major surface of the semiconductor substrate body 12 at a region inside the p-type base region 4, an n-type emitter region 5 is formed by selective diffusion of n-type impurities. In the n-type semiconductor layer 11, a region outside the p-type base region 4 and the n-type emitter region 5 are isolated from each other by the p-type base region 4. The emitter region 5 comprises first and second portions 5a and 5b in the section illustrated in FIG. 1.

On the top surface of the p-type base region 4 between the top surface of the n-type semiconductor layer 11 and the top major surface of the n-type emitter region 5, a gate insulation film 7 (i.e., insulating layer) is disposed. On the gate insulation film 7, a gate electrode 8 which is made of polysilicon (i.e., control electrode layer), for example, is formed facing the top surface of p-type base region 4. An emitter electrode 9 made of aluminum (second main electrode layer) is disposed in electrical connection to both the p-type base region 4 and the n-type emitter region 5. The gate electrode 8 and the emitter electrode 9 are insulated from each other. The gate electrodes 8 of the respective unit cells are electrically connected with each other and the emitter electrodes 9 of the respective unit cells are also electrically connected with each other. A collector electrode 10 which is made of metal such as aluminum (first main electrode layer) is electrically connected to the bottom major surface of the p-type semiconductor layer 1. The collector electrodes 10 of the respective unit cells are contiguous with each other.

The n-type semiconductor layer 11 includes a buffer layer 21 which is heavily doped n-type where it abuts the p-type semiconductor layer 1. Within the n-type semiconductor layer 11, the n-type semiconductor layer 3 excluding the buffer layer 21 has a relatively low impurity concentration equal to or less than about $5\times10^{14}$ cm$^{-3}$, for example. In the buffer layer 21, the concentration of n-type impurities is in the range between approximately $5\times10^{14}$ cm$^{-3}$ and $10^{17}$ cm$^{-3}$.

In addition, at a boundary between the buffer layer 21 and the p-type semiconductor layer 1, still other semiconductor regions, i.e., heavily doped n-type semiconductor region 22 is selectively formed. The impurity concentration of the heavily doped n-type semiconductor region 22 is in the range between approximately $10^{18}$ cm$^{-3}$ and $10^{21}$ cm$^{-3}$, a concentration equal to or more than about 100 times as high as that of the buffer layer 21.

<Brief Description of Operations of Device>

The operations of the device according to the first preferred embodiment will now be explained. First, a predetermined collector voltage $V_{CE}$ is applied between the emitter electrode 9 and the collector electrode 10. If in addition to this a gate voltage $V_{GE}$ exceeding the inherent threshold value of the MOS device formed by elements 40, 46, 7 and the portion of element 3 between 40 and 46 is applied between the emitter electrode 9 and the gate electrode 8, carriers, holes in this case, migrate from the p-type semiconductor layer 1 to the n-type semiconductor layer 11. As a result, the IGBT turns on, or in other words, the collector current $I_c$ flows from the collector electrode 10 to the emitter electrode 9.

Likewise in the buffer layer 2 of the conventional device, holes introduced from the p-type semiconductor layer 1 easily combine with electrons which exist in the heavily doped n-type buffer layer 21. Hence, in this device which comprises the buffer layer 21, the saturation collector current $I_c$(sat) is smaller and the ON-resistance is higher as compared with those of where the buffer layer 21 is not provided.

If the gate voltage $V_{GE}$ is reduced below the threshold value while keeping the collector voltage $V_{CE}$ at a predetermined value, the IGBT turns off, thereby no collector current $I_c$ flows. The buffer layer 21 prevents punch through due to growth of a depletion layer from the p-type base region 4 to the p-type semiconductor layer 1 during the device OFF-state, which feature being also shared by the buffer layer 2 of the conventional device. Therefore, in the device according to the first preferred embodiment, reduction in the thickness of the n-type semiconductor layer 3 is possible, allowing significant economics in production. In addition, the thin n-type semiconductor layer 3 reduces the turn-off time of the device.

<Detailed Description of Device ON-Operations>

The ON-operation of the device will be described in detail. In this device, the buffer layer 21, which has a relatively low concentration of the n-type impurities, and the n-type semiconductor region 22, which has a relatively high concentration of the n-type impurities, are arranged parallel with each other between the n-type semiconductor layer 3 and the p-type semiconductor layer 1. That is, a region which does not easily allow holes to flow from the p-type semiconductor layer 1 into the n-type semiconductor layer 3 is located parallel to a region which relatively easily allows holes to flow from the p-type semiconductor layer 1 into the n-type semiconductor layer 3. Injection of holes from the p-type semiconductor layer 1 into the n-type semiconductor layer 3 when the collector current $I_c$ is small is achieved by selective passage of holes at a region where the heavily doped n-type semiconductor region 22 does not exist. In other words, the collector current $I_c$ flows through selected region of buffer layer 21 where the heavily doped n-type semiconductor region 22 is not provided. As a result, when the collector current $I_c$ is small, the injection of the holes is dominant, so that the ON-resistance of the device is comparable with a device where the heavily doped n-type semiconductor region 22 is not provided.

On the other hand, if the collector current $I_c$ is large, under an overwhelmingly strong influence of a fact that the collector current $I_c$ is allowed to flow through only the region where the heavily doped n-type semiconductor regions 22 are not provided, flow of the collector current $I_c$ will be suppressed. That is, when the collector current $I_c$ is large, the collector current $I_c$ is lower than it would be if the device does not include the heavily doped n-type semiconductor region 22. Thus, the durability against destruction of the device is improved.

<Substantiation Data>

Figure 2:
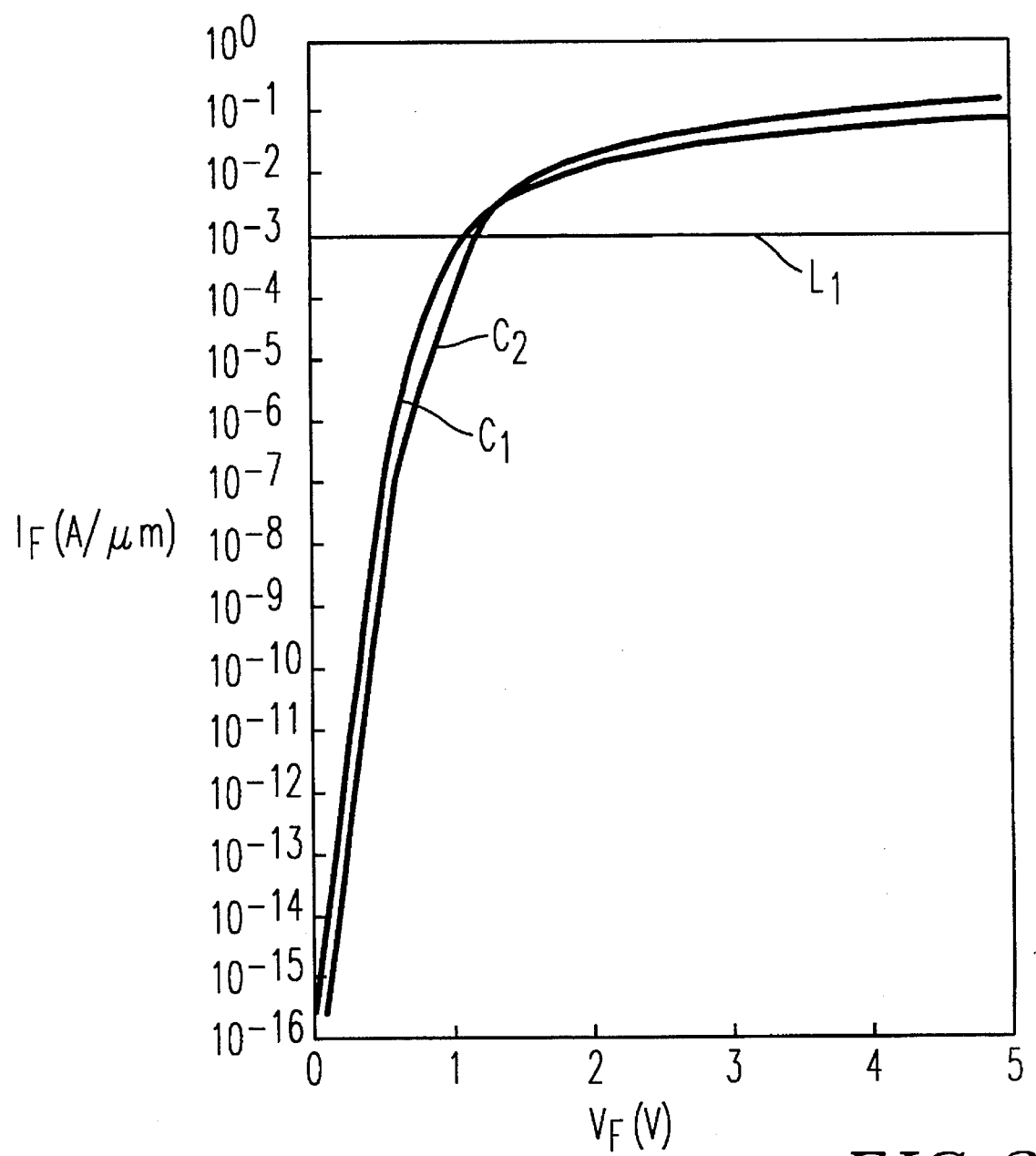
FIG. 2 is a graph showing simulation data which are compiled based on simulation.
Figure 3A:
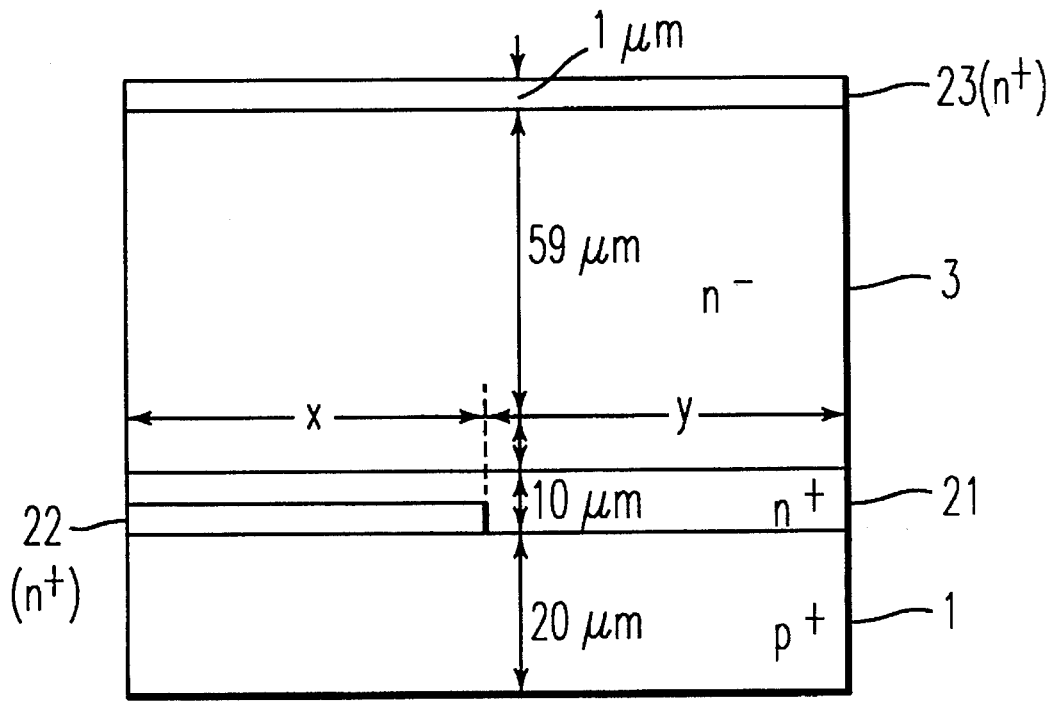
FIGS. 3A and 3B are cross sectional views showing the structures of model semiconductor devices used in the simulation shown in FIG. 2.
Figure 3B:
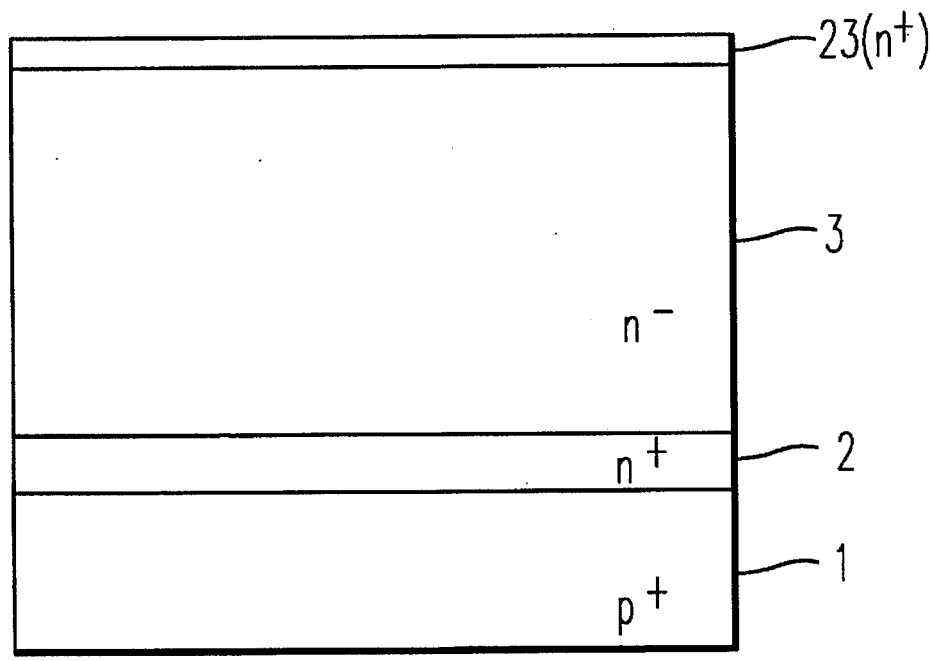

FIG. 2 is a graph showing simulation data which are compiled to illustrate the improvements possible with the device of the invention. FIGS. 3A and 3B are cross sectional views showing the structures of model semiconductor devices used in the simulation. The well known PISCES2B simulation was utilized.

As shown in FIGS. 3A and 3B, two models were established. One of the two models is a diode which corresponds to a portion of the IGBT of the first preferred embodiment (FIG. 3A). The diode comprises the p-type semiconductor layer 1, the buffer layer 21, the heavily doped n-type semiconductor region 22 and the n-type semiconductor layer 3, each having a thickness shown in FIG. 3A (typical thicknesses shown for example only). Between the p-type semiconductor layer 1 and the n-type semiconductor layer 3, the heavily doped n-type semiconductor region 22 is disposed over a width x which is equal to it width y over which the heavily doped n-type semiconductor region 22 is not provided. The n-type impurities are doped to the range between $5 \times 10^{14}$ cm$^{-3}$ and $10^{17}$ cm$^{-3}$ within the buffer layer 21 and to the range between $10^{18}$ cm$^{-3}$ and $10^{21}$ cm$^{-3}$ within the heavily doped n-type semiconductor region 22.

Another model is a diode which corresponds to a portion of the conventional IGBT (FIG. 3B). The model of FIG. 3B is different from the model of FIG. 3A in that the heavily doped n-type semiconductor region 22 is omitted. The concentration of the n-type impurities of the buffer layer 2 is set at around $10^{17}$ cm$^{-3}$. In each model, an extremely thin n-type semiconductor layer 23 of a high impurity concentration is formed on the n-type semiconductor layer 3.

These models each corresponds to a portion of an IGBT and has a structure which allows the determination of the quantity of holes which are injected from the p-type semiconductor layer 1 and the ON-resistance. By comparing the simulation results of the two models, differences in the structure and operation of the conventional IGBT and the IGBT according to the first preferred embodiment can be evaluated.

In FIG. 2, a forward current $I_F$ in each model diode is measured along the vertical axis of the graph and a forward voltage $V_F$ in each model diode is measured along the horizontal axis of the graph. The forward current $I_F$ and the forward voltage $V_F$ respectively correspond to the collector current $I_c$ and the collector voltage $V_{CE}$. Curves labelled C1 and C2 represent the simulation results of the diodes of FIGS. 3A and 3B, respectively. A straight line $L_1$ denotes a current density of 100 A/cm$^2$ which corresponds to the collector current $I_c$ of the IGBT under normal environment.

FIG. 2 shows that, as compared with the curve C2, the curve C1 indicates a relatively smaller forward voltage $V_F$ in a region where the forward current $I_F$ is small. In a region where the forward current $I_F$ is large, the curve C1 indicates a smaller forward current $I_F$ than that indicated by the curve C2 against the same forward voltage $V_F$. As compared with the conventional IGBT, the IGBT of the first preferred embodiment has a lower ON-resistance in the small forward current region and, in the large forward current region, the collector current $I_c$ is smaller against the same forward voltage $V_F$. Thus, the simulation data agree with the description above regarding the device of the first preferred embodiment.

If the ON-current of the device of the first preferred embodiment is set the same as that of the conventional device for the same normal rated current (i.e., 50 to 150 A/cm$^2$), a substantially larger reduction in the collector current $I_c$ is possible in the large forward current region as compared with that in the conventional device. In short, the durability against destruction of the device is extremely enhanced. On the other hand, by setting the value of the collector current $I_c$ in the large forward current region the same as that of the conventional device, the current capacity around the normal rated current of the first preferred embodiment is increased and the ON-resistance is suppressed drastically low.

<<Second Preferred Embodiment>>

Figure 4:
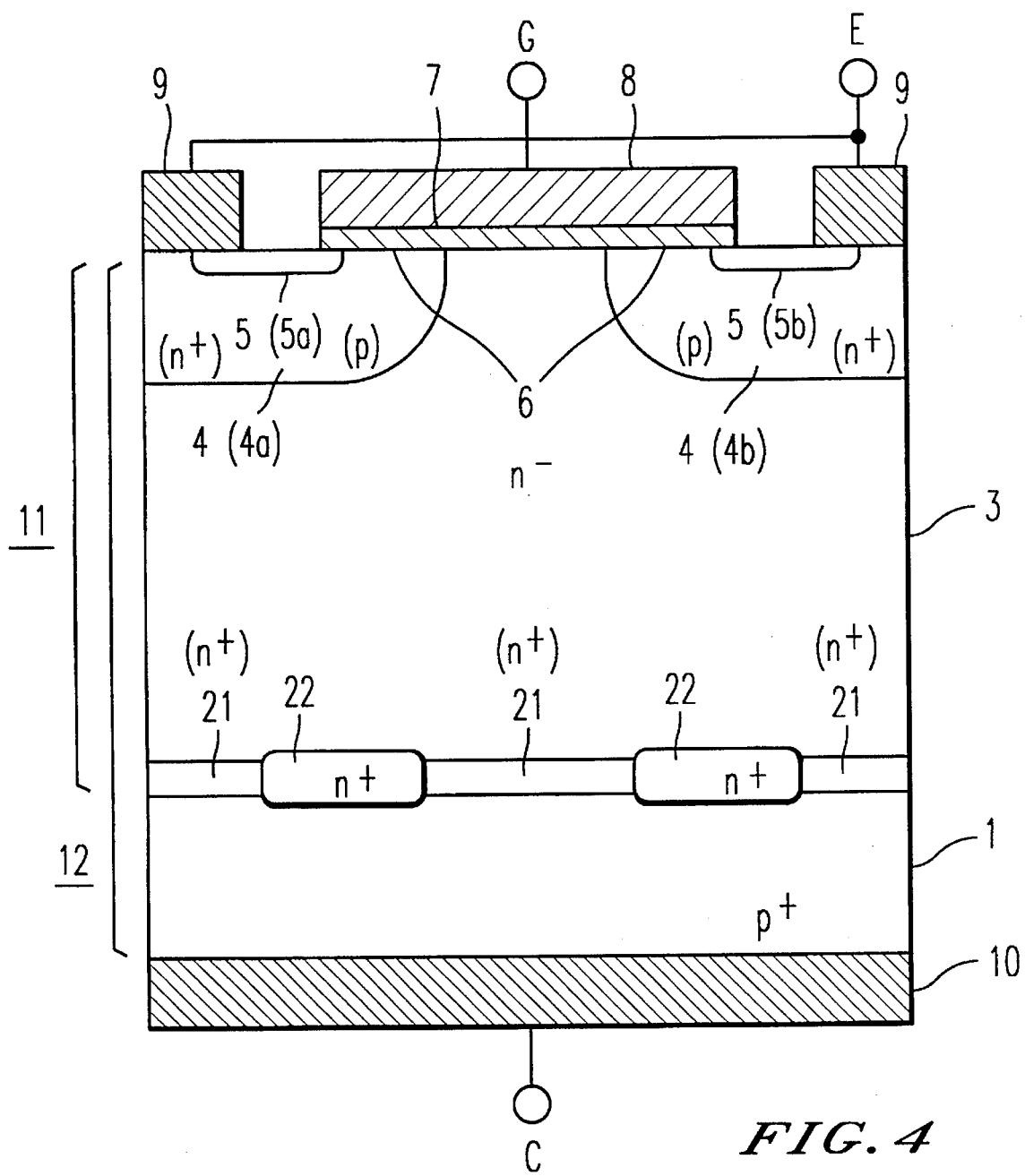
FIG. 4 is a cross sectional view showing the structure of an insulated gate semiconductor device according to a second preferred embodiment of the present invention.

FIG. 4 is a cross sectional view showing the structure of an IGBT according to a second preferred embodiment of the present invention. The device according to the second preferred embodiment is different from the device of the first preferred embodiment in that the buffer layer 21 is thinner than the heavily doped n-type semiconductor region 22 and the buffer layer 21 is not formed on the top surface of the heavily doped n-type semiconductor region 22. In terms of the ranges of the concentrations of the n-type impurities inf the n-type semiconductor layer 3, the buffer layer 21 and the heavily doped n-type semiconductor region 22 the second preferred embodiment is similar to the first preferred embodiment.

In the device of the second preferred embodiment, the buffer layer 21 of a relatively low n-type impurity concentration or alternatively the heavily doped n-type semiconductor region 22 exists between the n-type semiconductor layer 3 and the p-type semiconductor layer 1. Hence, during the device OFF-state, punch through due to growth of a depletion layer from the p-type base region 4 to the p-type semiconductor layer 1 is prevented by the buffer layer 21 or alternatively the heavily doped n-type semiconductor region 22.

In the device of the second preferred embodiment as in the device of the first preferred embodiment, the buffer layer 21 which is relatively lightly doped n-type and the n-type semiconductor region 22, which is doped n-type heavier than the buffer layer 21 are arranged parallel with each other between the n-type semiconductor layer 3 and the p-type semiconductor layer 1. Hence, holes from the p-type semiconductor layer 1 pass through the n-type semiconductor layer 11 at a selected region (layer 21). As a result, similar to the device of the first preferred embodiment, the device of the second preferred embodiment has a lower ON-resistance than that of the conventional device. Moreover, the collector current $I_c$ in the large forward current region is suppressed lower than that in the conventional device.

In addition, when designed so that the ON-resistance is equal to that of the conventional device, the device of the second preferred embodiment has a further lower collector current $I_c$ in the large forward current region as compared with that in the conventional device. Further, by setting the value of the collector current $I_c$ in the large forward current region the same as that of the conventional device, the current capacity around the normal rated current of the second preferred embodiment is increased and the ON-resistance is suppressed even lower as compared with the conventional device.

<<Third Preferred Embodiment>>

Figure 5:
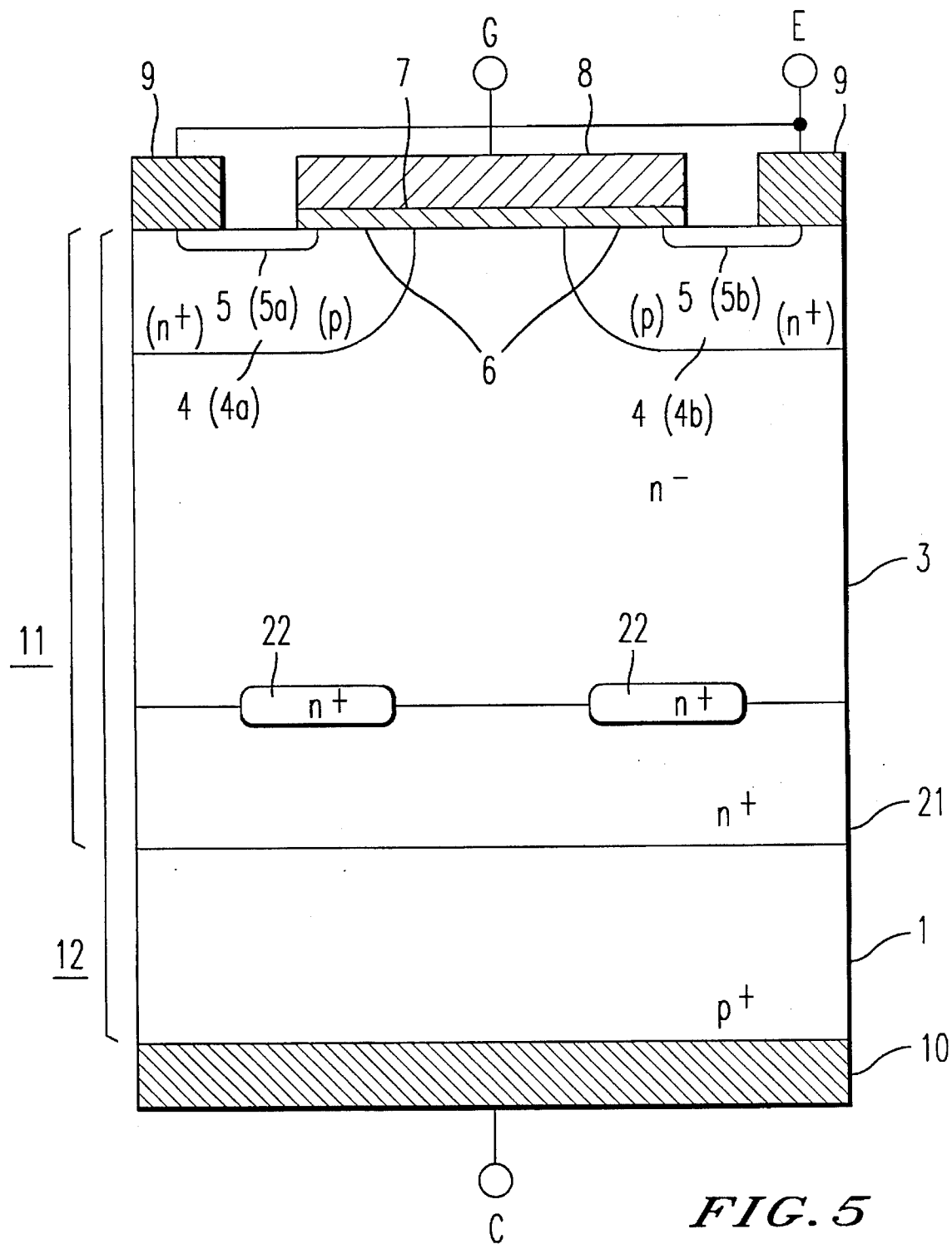
FIG. 5 is a cross sectional view showing the structure of an insulated gate semiconductor device according to a third preferred embodiment of the present invention.

FIG. 5 is a cross sectional view showing the structure of an IGBT according to a third preferred embodiment of the present invention. The device according to the third preferred embodiment is different from the device of the first preferred embodiment of FIG. 1 in that the heavily doped n-type semiconductor region 22 is selectively formed between the n-type semiconductor layer 3 and the buffer layer 21. In terms of the ranges of the concentrations of the n-type impurities in the n-type semiconductor layer 3, the buffer layer 21 and the heavily doped n-type semiconductor region 22, the third preferred embodiment is similar to the first preferred embodiment.

Also in the device according to the third preferred embodiment, the buffer layer 21 of a relatively high n-type impurity concentration or alternatively the heavily doped n-type semiconductor region 22 exists between the n-type semiconductor layer 3 and the p-type semiconductor layer 1. Hence, during the device OFF-state, punch through due to growth of a depletion layer from the p-type base region 4 to the p-type semiconductor layer 1 is prevented by the buffer layer 21 or alternatively the heavily doped n-type semiconductor region 22.

Similar to the device of the first preferred embodiment, the device of the third preferred embodiment has a structure in which the buffer layer 21 which is relatively lightly doped n-type and the n-type semiconductor region 22 which is relatively heavily doped n-type are arranged parallel with each other between the n-type semiconductor layer 3 and the p-type semiconductor layer 1. This reduces the ON-resistance and the collector current $I_c$ in the large forward current region lower than those in the conventional device. In addition, if the device of the third preferred embodiment is designed so as to have an ON-resistance which is equal to that of the conventional device, a further lower collector current $I_c$ in the large forward current region than that in the conventional device is attained. Moreover, by setting the value of the collector current $I_c$ in the large forward current region the same as that of the conventional device, the current capacity around the normal rated current of the third preferred embodiment is increased and the ON-resistance is suppressed even lower as compared with the conventional device.

<<Fourth Preferred Embodiment>>

Figure 6:
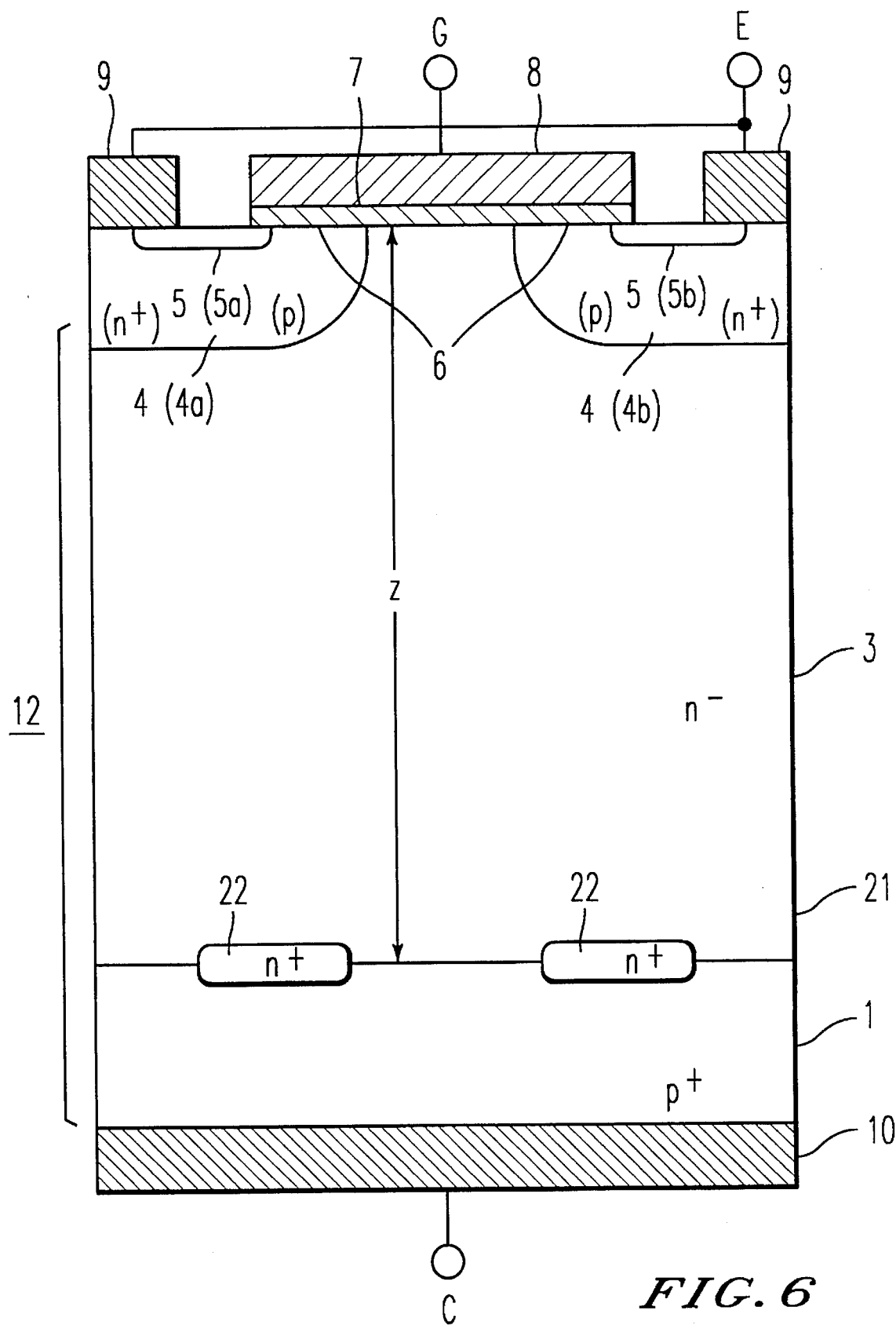
FIG. 6 is a cross sectional view showing the structure of an insulated gate semiconductor device according to a fourth preferred embodiment of the present invention.

FIG. 6 is a cross sectional view showing the structure of an IGBT according to a fourth preferred embodiment of the present invention. Omission of the buffer layer 21 in the device of the fourth preferred embodiment is a difference between the device of the fourth preferred embodiment and the device of the first preferred embodiment shown in FIG. 1. The heavily doped n-type semiconductor region 22 is selectively disposed between the n-type semiconductor layer 3 and the p-type semiconductor layer 1. The n-type semiconductor layer 3 and the heavily doped n-type semiconductor region 22 respectively have the same n-type impurity concentrations as those of the equivalent layer and region of the first preferred embodiment.

In the device of the fourth preferred embodiment, where the heavily doped n-type semiconductor region 21 is not provided, the n-type semiconductor layer 3 and the p-type semiconductor layer 1 are directly joined to each other without an interposed heavily doped n-type semiconductor layer. Hence, to prevent punch through due to growth of a depletion layer from the p-type base region 4 to the p-type semiconductor layer 1 during the device OFF-state, the n-type semiconductor layer 3 is formed to have a sufficiently large thickness z.

In the device of the fourth preferred embodiment, the n-type semiconductor layer 3 which is relatively lightly doped n-type and the n-type semiconductor region 22 which is relatively heavily doped n-type are arranged parallel with each other on the top surface of the p-type semiconductor layer 1. This reduces the ON-resistance and the collector current $l_c$ in the large forward current region lower than those in the conventional device. In addition, if the device of the fourth preferred embodiment is designed so as to have an ON-voltage which is equal to that of the conventional device, a further lower collector current $I_c$ in the large forward current region than that in the conventional device is attained. Moreover, by setting the value of the collector current $I_c$ in the large forward current region the same as that of the conventional device, the current capacity around the normal rated current of the fourth preferred embodiment is increased and the ON-resistance is suppressed even lower as compared with the conventional device.

<<Fifth Preferred Embodiment>>

Figure 7:
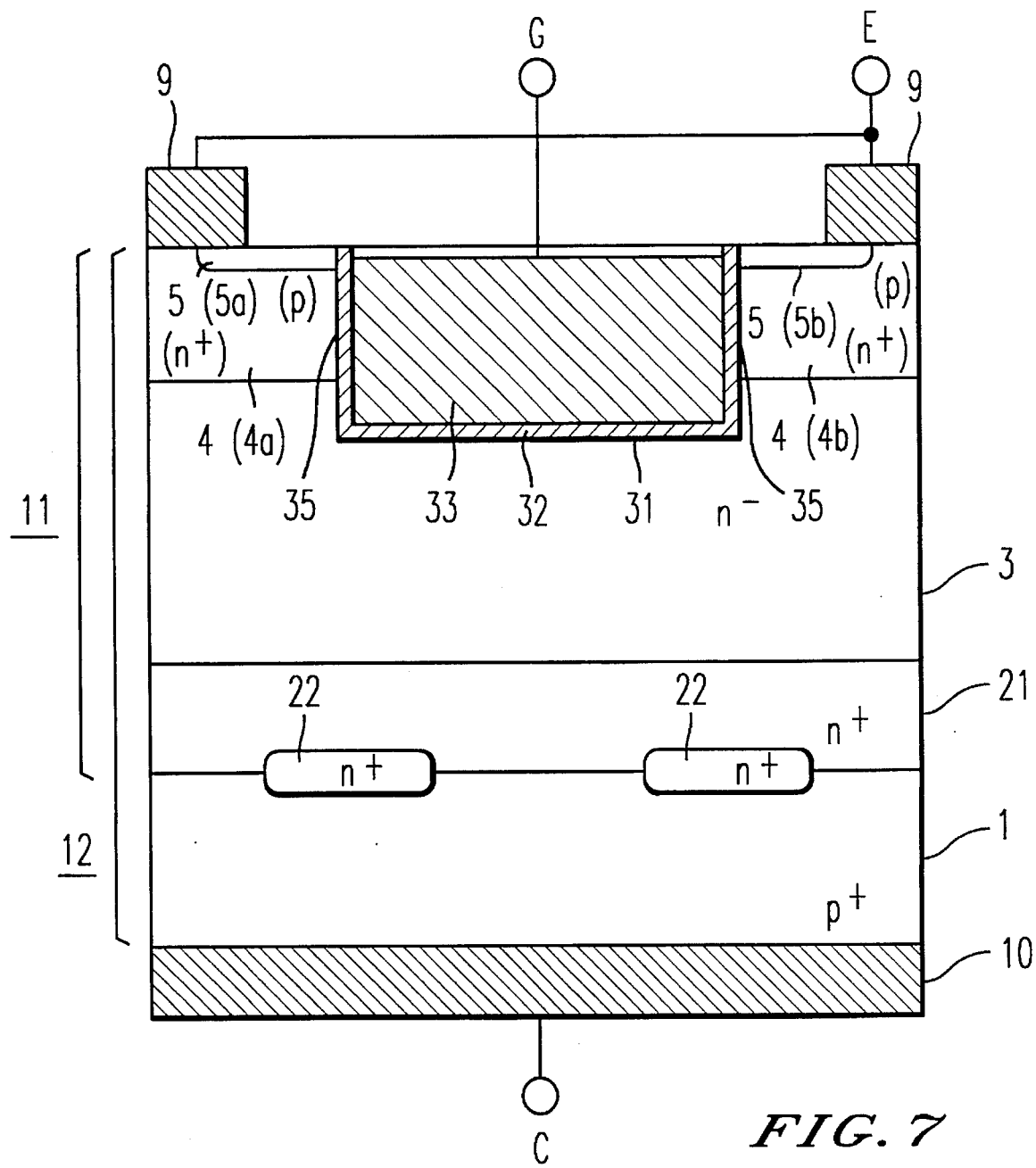
FIG. 7 is a cross sectional view showing the structure of an insulated gate semiconductor device according to a fifth preferred embodiment of the present invention.

FIG. 7 is a cross sectional view showing the structure of an IGBT according to a fifth preferred embodiment of the present invention. The device according to the fifth preferred embodiment is different from the device of the first preferred embodiment in terms of the structure of an upper portion of the n-type semiconductor layer 3. The device of the fifth preferred embodiment, known as an U-type IGBT, is advantageous over the devices of the preceding embodiments since it can be formed denser in an easy manner. In addition, since the p-type base region 4 can be formed on the entire top major surface of the n-type semiconductor layer 11 during fabrication and therefore there is no need for selectively forming the p-type base region 4, manufacturing of the device is less complex.

Similar to the device of the first preferred embodiment, the p-type base region 4 and the n-type emitter region 5 are formed in the top surface of the n-type semiconductor layer 3. A groove 31 is also formed in the top surface of the n-type semiconductor layer 3 so that the side walls of the groove 31 extend across the n-type emitter region 5, the p-type base region 4 and into the n-type semiconductor layer 3. Along the inner wall surfaces of the groove 31, a gate insulation film 32 (insulating layer) is disposed. A gate electrode 33 made of polysilicon (control electrode layer) is buried inside the insulation film 32. Hence, the device of the fifth preferred embodiment is similar to the devices of the preceding preferred embodiments in that the gate electrode 33 is disposed facing the surface of the p-type base region 4. With application of the gate voltage $V_{GE}$ of a predetermined value, the p-type base region 4 is inverted into the n-type at a channel region 35 which is formed in the vicinity of the gate electrode 33, creating an n-type channel at the channel region 35. Carriers, in this case electrons, are introduced from the emitter electrode 9 into the n-type semiconductor layer 3 through this channel, thereby turning on the device. That is, the device of the fifth preferred embodiment operates in a way similar to the device of the first preferred embodiment. In terms of the ranges of concentration of the n-type impurities in the buffer layer 21 and the heavily doped n-type semiconductor region 22, the fifth preferred embodiment is similar to the first preferred embodiment.

Likewise in the device of the first preferred embodiment, in the device of the fifth preferred embodiment, the buffer layer 21 of a relatively low n-type impurity concentration and the n-type semiconductor region 22 of a relatively high n-type impurity concentration are arranged parallel with each other between the n-type semiconductor layer 3 and the p-type semiconductor layer 1. Hence, similar to the device of the first preferred embodiment, the ON-resistance and the collector current $I_c$ in the large forward current region are suppressed to be low. In addition, if the device of the fifth preferred embodiment is designed so as to have an ON-current which is equal to that of the conventional device, a further lower collector current $I_c$ in the large forward current region than that in the conventional device is attained. Moreover, by setting the value of the collector current $I_c$ in the large forward current region the same as that of the conventional device, the current capacity around the normal rated current of the fifth preferred embodiment is increased and the ON-resistance is suppressed even lower as compared with the conventional device.

<<Sixth Preferred Embodiment>>

Figure 8:
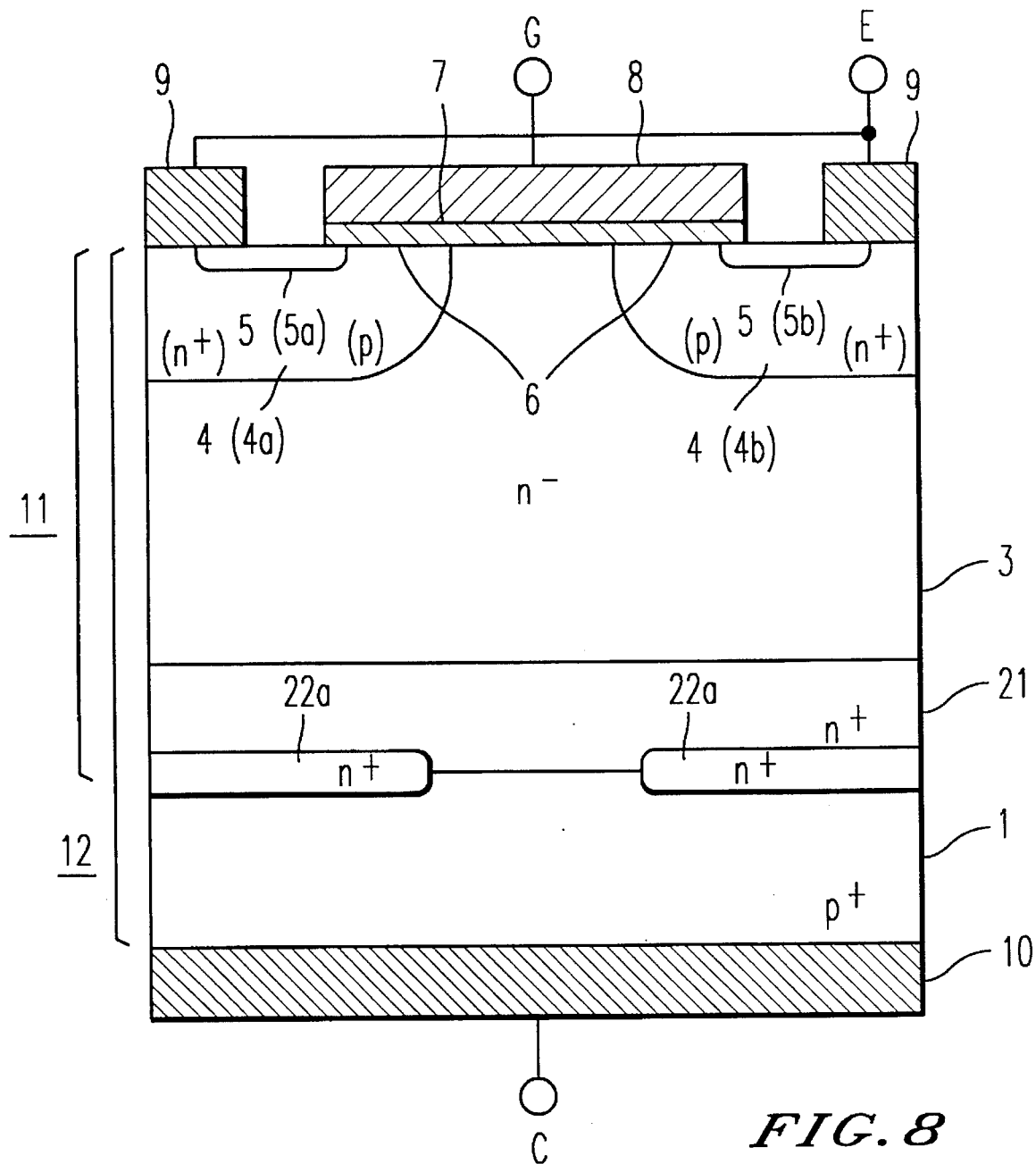
FIG. 8 is a cross sectional view showing the structure of an insulated gate semiconductor device according to a sixth preferred embodiment of the present invention.

FIG. 8 is a cross sectional view showing the structure of the IGBT according to a sixth preferred embodiment of the present invention. In the device of this embodiment, the heavily doped n-type semiconductor region 22 is formed in a different configuration from that of the device of the first preferred embodiment. As shown in FIG. 1, in the device of the first preferred embodiment, the heavily doped n-type semiconductor region 22 is formed as two portions which are spaced apart from each other in one unit cell. In this embodiment, however, the heavily doped n-type semiconductor region 22a is formed as one integrated portion in one unit cell. That is, the heavily doped n-type semiconductor region is disposed as a continued region right below approximately the whole p-type base region 4 to have a gap right below the n-type semiconductor layer which separates the two portions 4a and 4b of the p-type base region 4. The device of this embodiment also functions as the device of the first preferred embodiment and has similar effects.

<<Seventh Preferred Embodiment>>

Figure 9:
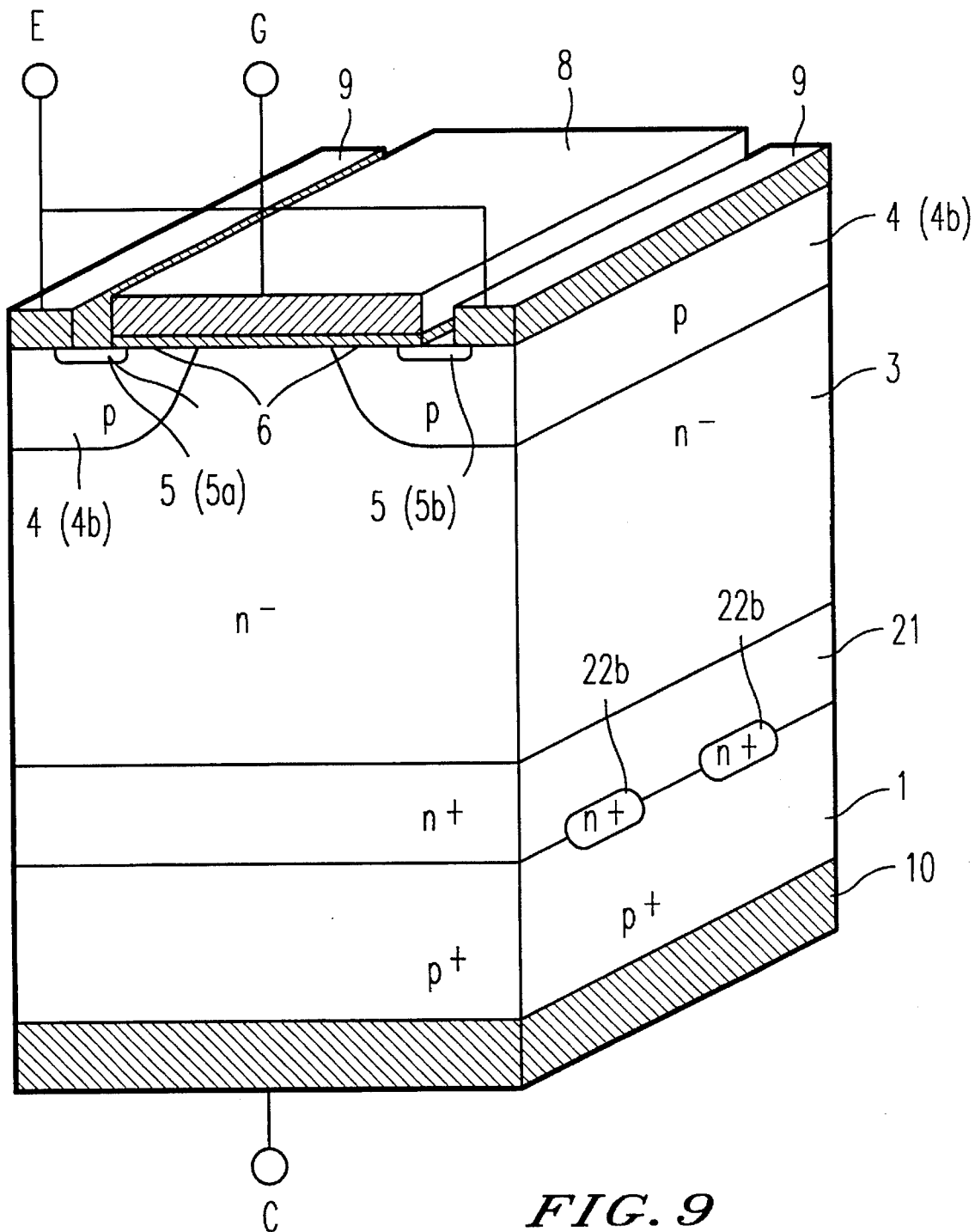
FIG. 9 is a cross sectional view showing the structure of an insulated gate semiconductor device according to a seventh preferred embodiment of the present invention.

FIG. 9 is a cross sectional perspective view showing the structure of the IGBT according to a seventh preferred embodiment of the present invention. In the device of this embodiment, the heavily doped n-type semiconductor region 22 is disposed in a different direction from the heavily doped n-type semiconductor region 22 of the device of the first preferred embodiment. As shown in FIG. 1, in the device of the first preferred embodiment, the p-type base region 4 formed in the shape of stripes in the top major surface of the n-type semiconductor layer 11 runs parallel to the heavily doped n-type semiconductor region 22 which is also formed in the shape of stripes. On the other hand, as shown in FIG. 9, in the device of this embodiment, the heavily doped n-type semiconductor region 22b runs perpendicular to the p-type base region 4.

In the devices of the first and other preferred embodiments, since the p-type base region 4 and the heavily doped n-type semiconductor region 22 are parallel to each other, a positional relation between the gaps of the heavily doped n-type semiconductor region 22 and the gaps of the p-type base region 4 affects the characteristics of the device. To deal with this, the positional relation must be adjusted accurately if not very strictly accurately. In the device of this embodiment, however, since the heavily doped n-type semiconductor region 22b and the p-type base region 4 are disposed in intersecting directions, a positional relation between the two can be decided with no restriction. This eliminates the necessity of accurately aligning the mask pattern for formation of the heavily doped n-type semiconductor region 22 during fabrication of the device, which makes the fabrication simple. In addition, the characteristics of the device would not vary among products.

Although FIG. 9 shows an example where the p-type base region 4 and the heavily doped n-type semiconductor region 22b run perpendicular to each other, as far as being disposed in directions which cross each other with a certain angle, the same effects are attainable.

<<Eighth Preferred Embodiment>>

Figure 10:
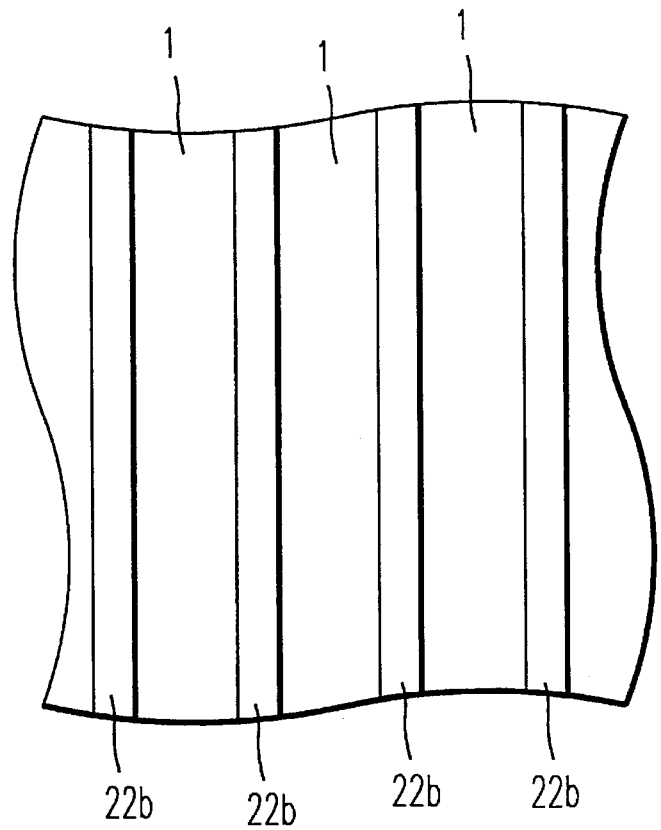
FIG. 10 is a cross sectional view showing the configuration of a heavily doped n-type semiconductor region in the seventh preferred embodiment of the present invention.
Figure 11:
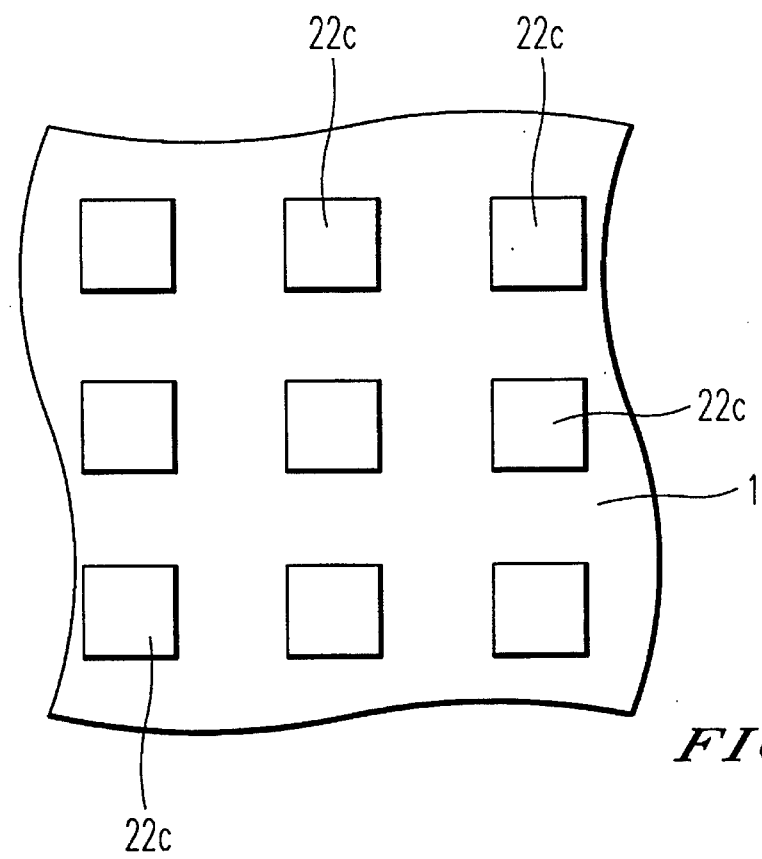
FIG. 11 is a cross sectional view showing the configuration of a heavily doped n-type semiconductor region in other embodiment of the present invention.
Figure 12:
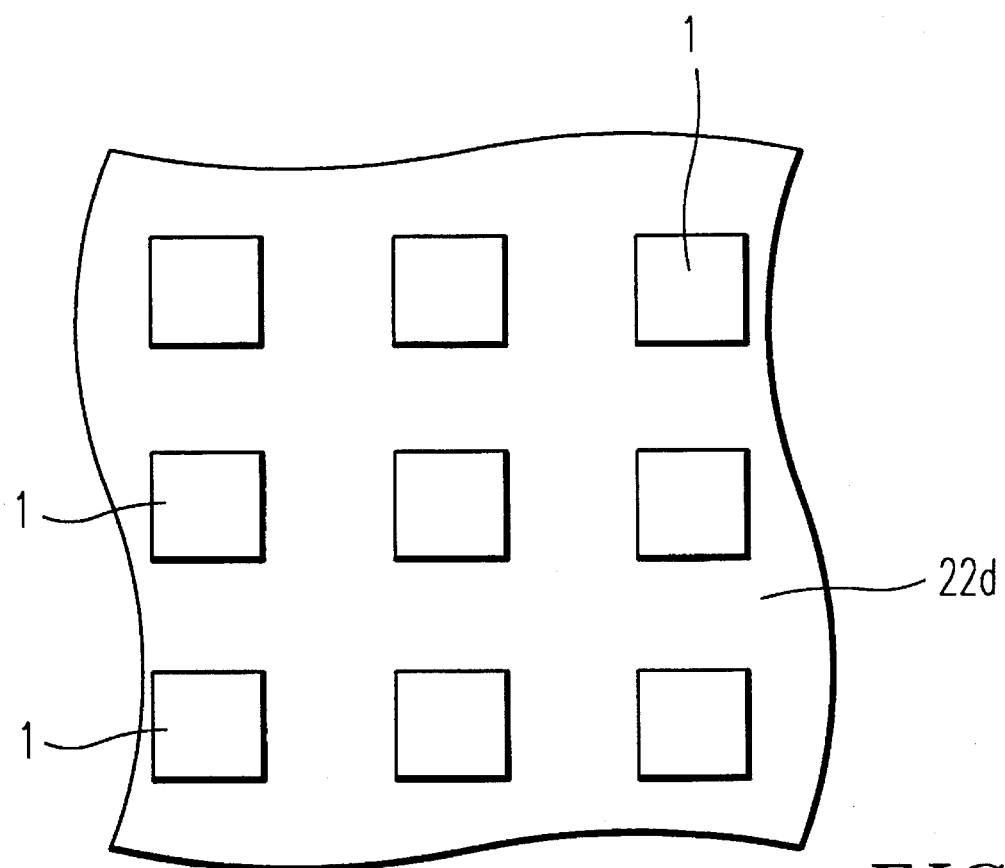
FIG. 12 is a cross sectional view showing the configuration of a heavily doped n-type semiconductor region in still other embodiment of the present invention.

The configuration of the heavily doped n-type semiconductor region 22 is not limited to that shown in FIG. 1 but can vary. Here, various possible configurations of the heavily doped n-type semiconductor region 22 will be described. FIGS. 10 to 12 are plan views of three different configurations each in the interface between the p-type semiconductor layer 1 and the n-type semiconductor layer 11. FIG. 10 shows the configuration of the heavily doped n-type semiconductor region 22 in the seventh preferred embodiment of FIG. 9, namely, the heavily doped n-type semiconductor region 22b which are in the form of parallel stripes. The heavily doped n-type semiconductor region 22 of FIG. 1 and the like has a similar configuration. Although the heavily doped n-type semiconductor region 22a shown in FIG. 8 is in a similar configuration, the width and the pitch of the stripes are different.

The heavily doped n-type semiconductor region 22c shown in FIG. 11 includes a plurality of small square regions which are arranged with a space from each other in a matrix. The small regions may not be square.

The heavily doped n-type semiconductor region 22d shown in FIG. 12 is somewhat similar to the heavily doped n-type semiconductor region 22c and the p-type semiconductor layer 1 of FIG. 11 replaced to each other. In other words, the heavily doped n-type semiconductor region 22d is in the form of a lattice or cross stripes which includes square openings. The openings may not be square.

In the following, methods of manufacturing the devices of the present invention will be described.

<<Manufacturing Process of First Preferred Embodiment>>

Figure 13A:
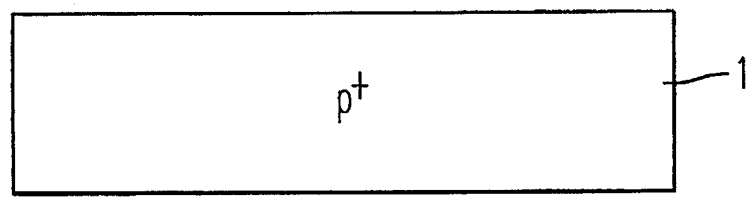
FIGS. 13A to 13C are cross sectional views showing the device of the first preferred embodiment during successive stages of fabrication.
Figure 13B:
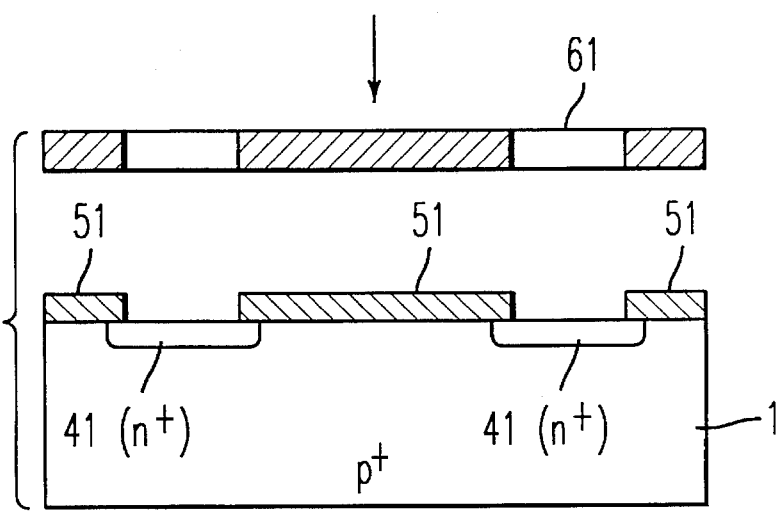
Figure 13C:
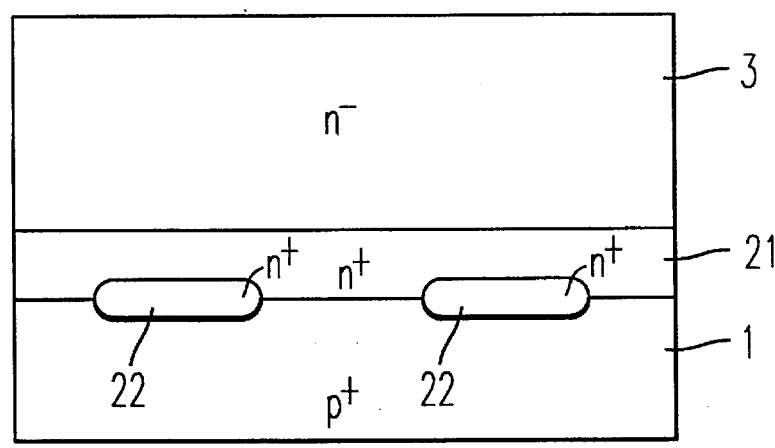
Figure 21:
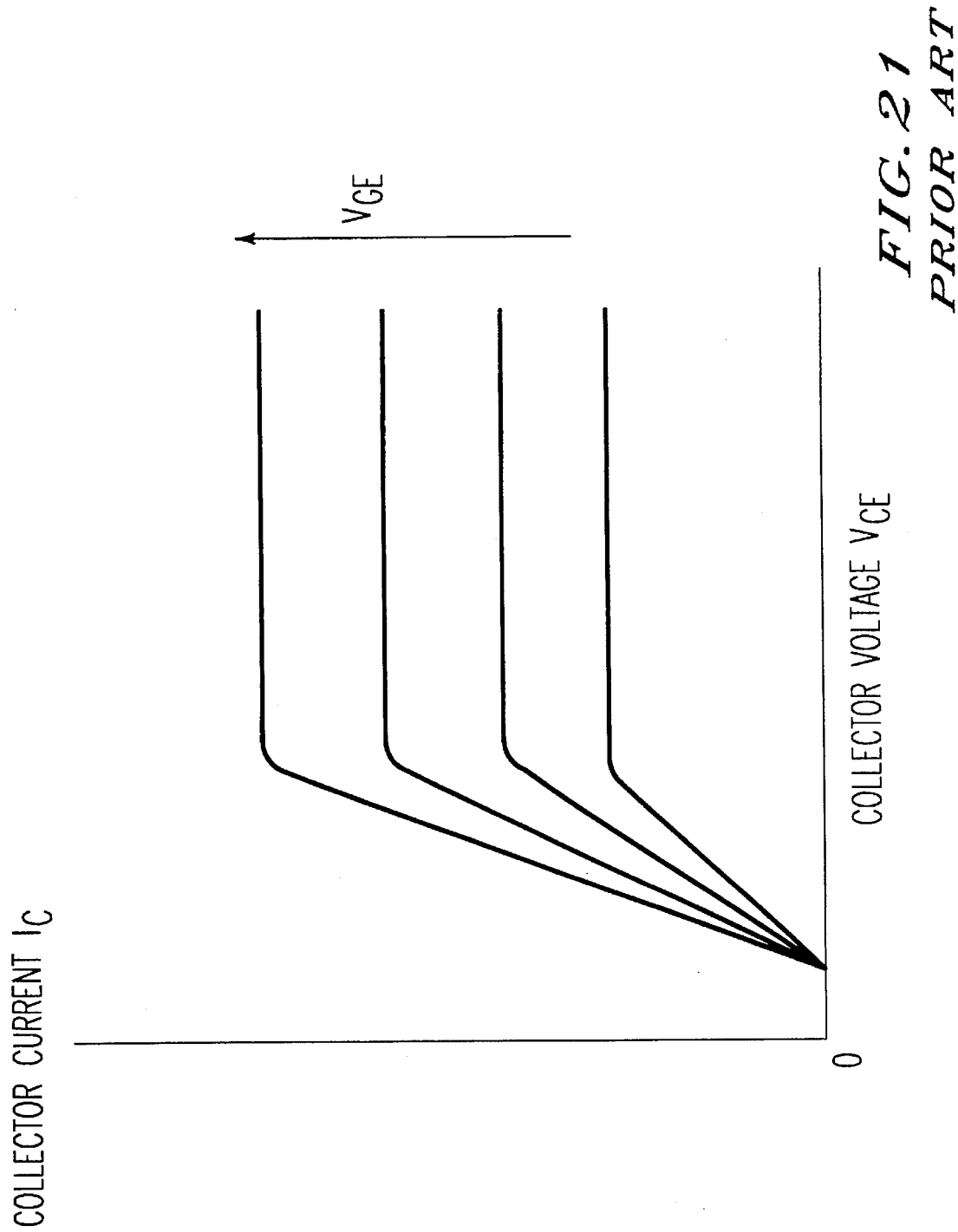
FIG. 21 is a graph showing output characteristics of the conventional device.
Figure 22:
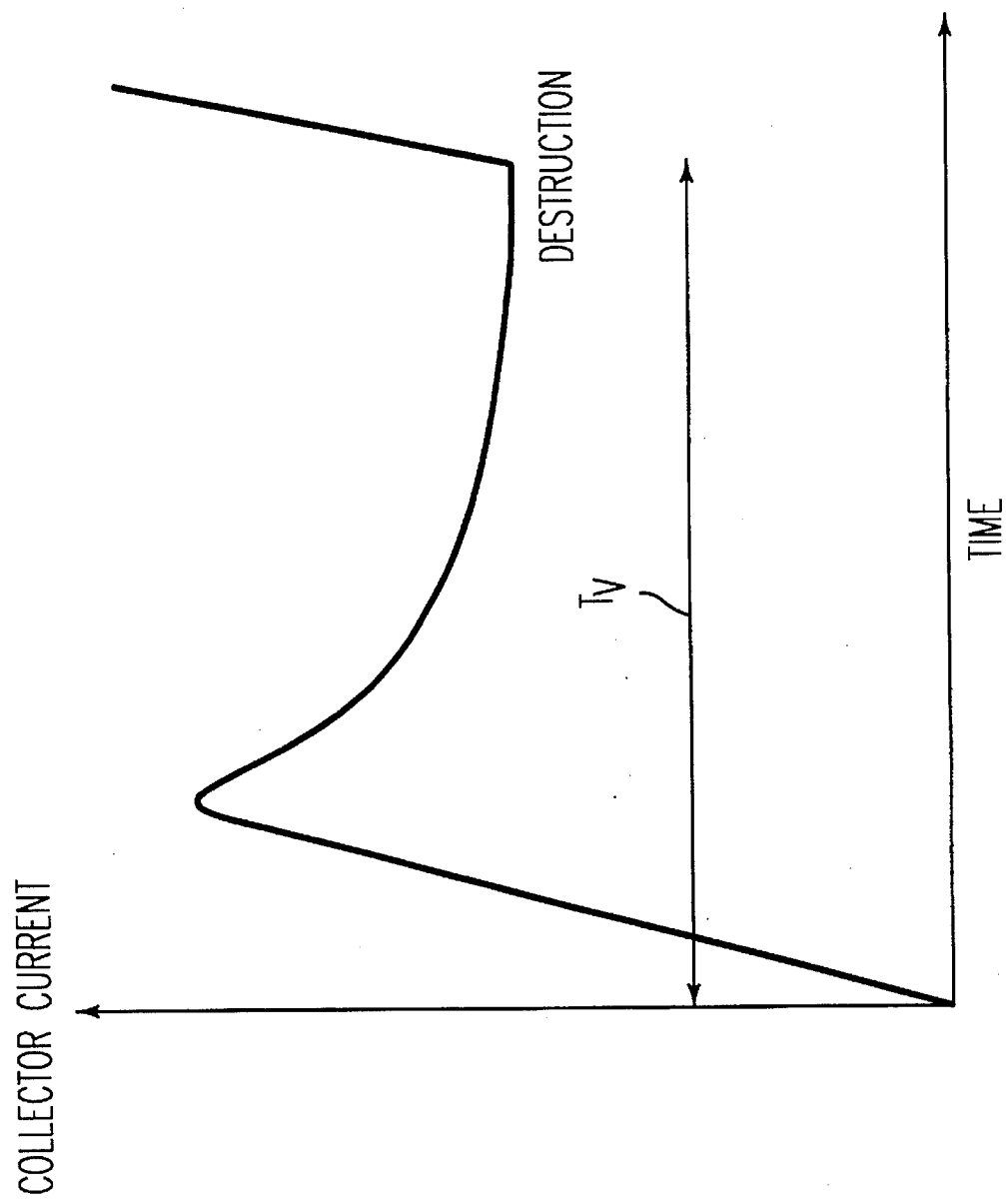
FIG. 22 is a graph showing a change in a collector current with a change in time during short circuiting.

FIGS. 13A to 13C are cross sectional views showing the device of the first preferred embodiment (FIG. 1) during successive stages of fabrication. A first step of manufacturing the device of the first preferred embodiment is preparation of a p-type silicon substrate which corresponds to the p-type collector layer 1 (FIG. 13A). Next, the p-type collector layer 1 is covered at the entire top major surface with a resist layer from which a resist pattern 51 (shielding film) will be subsequently formed by a photolithography process through a mask 61. Following this, n-type impurities such as As are selectively implanted through the pattern 51, thereby defining an n-type semiconductor region 41 in the top surface of the p-type semiconductor layer 1 (FIG. 21B). The buffer layer 21 is then epitaxially grown on the p-type semiconductor layer 1, in the course of which the n-type impurities of the n-type semiconductor region 41 diffuse outside to thereby define the heavily doped n-type semiconductor region 22 between the buffer layer 21 and the p-type semiconductor layer 1. The n-type semiconductor layer 3 is then epitaxially grown on the buffer layer 21 (FIG. 21C).

The device of the first preferred embodiment is hereinafter manufactured using conventional processing techniques. More particularly, the top surface of the n-type semiconductor layer 3 is locally doped to form the p-type base region 4 and the n-type emitter region 5 thereat. Then, the gate insulation film 7, the gate electrode 8 and the emitter electrode 9 are connected. Further, the collector electrode 10 is connected to the bottom major surface of the p-type semiconductor layer 1 (FIG. 1).

<<Manufacturing Process of Second Preferred Embodiment>>

Figure 14A:
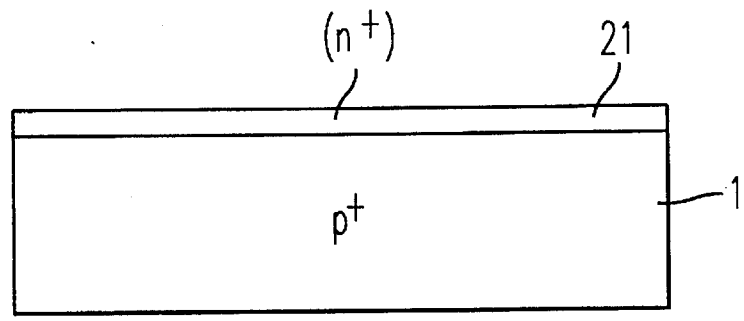
FIGS. 14A to 14C are cross sectional views showing the device of the second preferred embodiment during successive stages of fabrication.
Figure 14B:
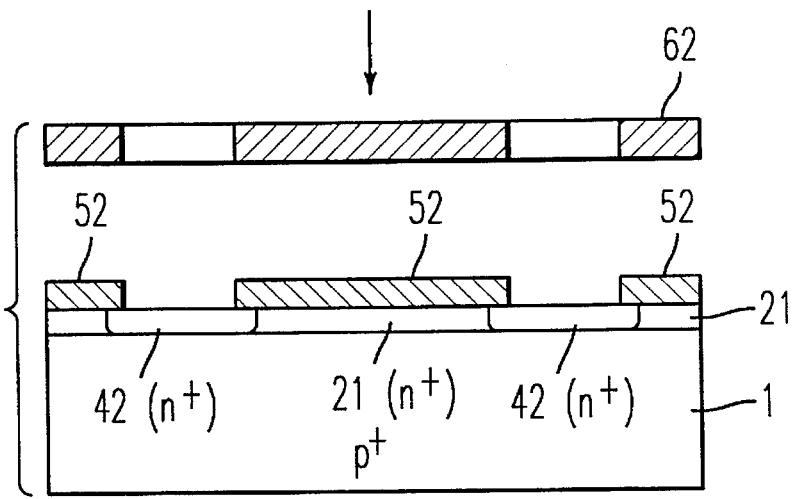
Figure 14C:
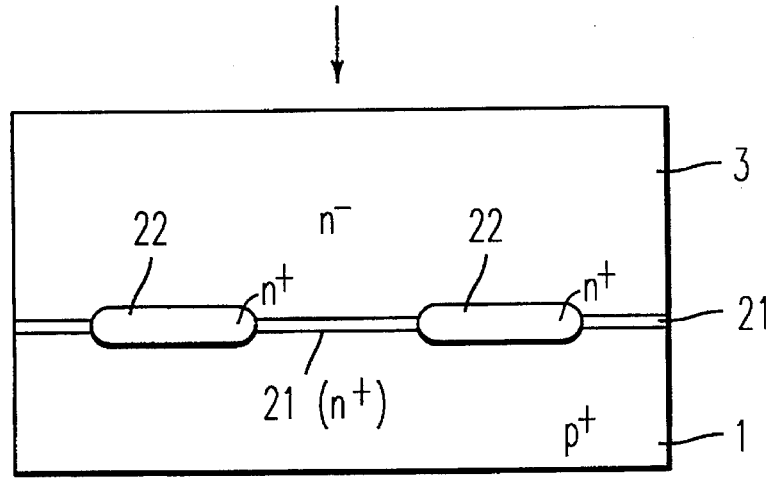

FIGS. 14A to 14C are cross sectional views showing the device of the second preferred embodiment (FIG. 4) during successive stages of fabrication. First, a p-type silicon substrate which corresponds to the p-type collector layer 1 is prepared. Next, the buffer layer 21 is formed on the p-type collector layer 1 by epitaxial growth. The buffer layer 21 is formed to a thickness which does not exceed the thickness of the heavily doped n-type semiconductor region 22 which will be formed later (FIG. 14A). A resist layer is then formed entirely over the top major surface of the p-type collector layer 1 and patterned through a mask 62 by a photolithography process to thereby define a resist pattern 52 (shielding film). Next, n-type impurities such as As are selectively implanted through the resist pattern 52, thereby defining an n-type semiconductor region 42 in the top surface of the buffer layer 21 (FIG. 14B). The resist pattern 52 is then removed, followed by epitaxial growth of the n-type semiconductor layer 3 on the buffer layer 21. The n-type impurities of the n-type semiconductor region 42 diffuse into the n-type semiconductor layer 3 and p-type collector layer 1 while the layer 3 is epitaxially grown so that the heavily doped n-type semiconductor region 22 is formed between the n-type semiconductor layer 3 and the p-type semiconductor layer 1 (FIG. 14C). The device shown in FIG. 4 is hereinafter completed by procedures similar to those used to fabricate the device of the first preferred embodiment.

<<Manufacturing Process of Third Preferred Embodiment>>

Figure 15A:
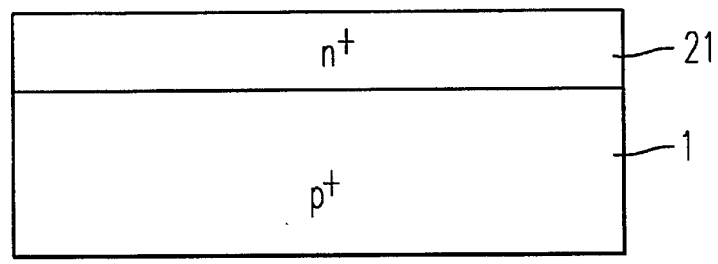
FIGS. 15A to 15C are cross sectional views showing the device of the third preferred embodiment during successive stages of fabrication.
Figure 15B:
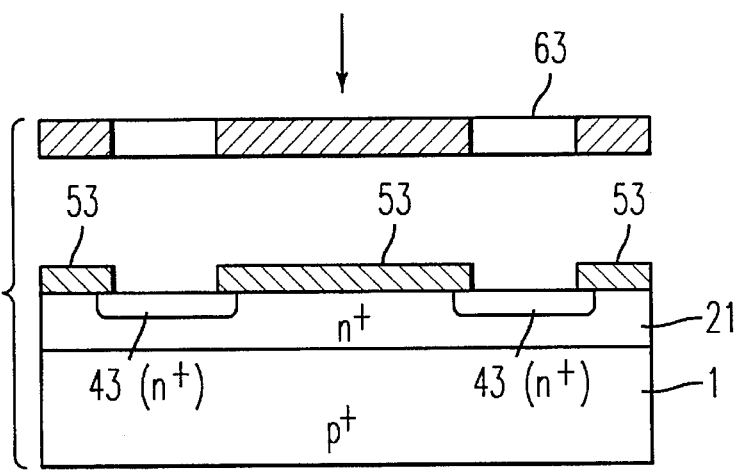
Figure 15C:
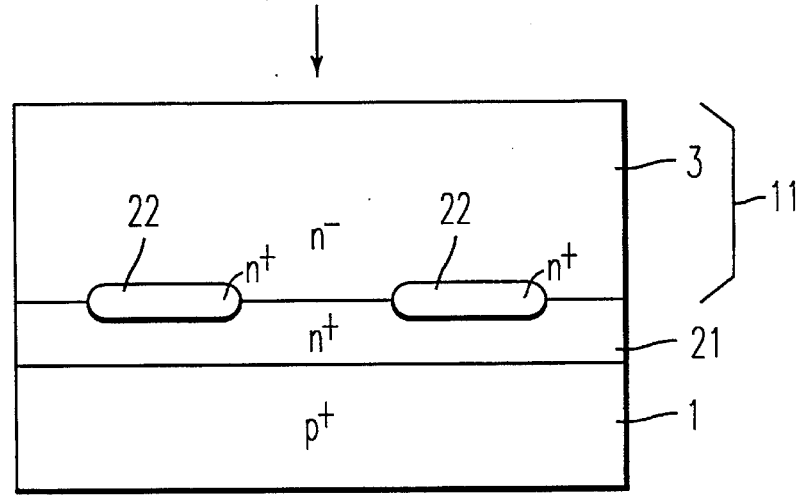

FIGS. 15A to 15C are cross sectional views showing the device of the third preferred embodiment (FIG. 5) during successive stages of fabrication. First, a p-type silicon substrate which corresponds to the p-type collector layer 1 is prepared. Next, the buffer layer 21 is formed on the p-type collector layer 1 by epitaxial growth. The buffer layer 21 is formed to a thickness which is sufficiently larger than the thickness of the heavily doped n-type semiconductor region 22 which will be formed later (FIG. 15A). Next, the buffer layer 21 is covered at the entire top major surface with a resist layer from which a resist pattern 53 (shielding film) will be subsequently formed by a photolithography process through a mask 63. Following this, n-type impurities such as As are selectively implanted through the resist pattern 53, thereby defining an n-type semiconductor region 43 in the top surface of the buffer layer 21 (FIG. 15B). The resist pattern 53 is then removed, followed by epitaxial growth of the n-type semiconductor layer 3 on the buffer layer 21. The n-type impurities of the n-type semiconductor region 43 diffuse into the n-type semiconductor layer 3 and the buffer layer 21 while the layer is epitaxially grown so that the heavily doped n-type semiconductor region 22 is formed between the n-type semiconductor layer 3 and the buffer layer 21 (FIG. 15C). The device shown in FIG. 5 is hereinafter completed by procedures similar to those used to fabricate the device of the first preferred embodiment.

<<Manufacturing Process of Fourth Preferred Embodiment>>

Figure 16A:
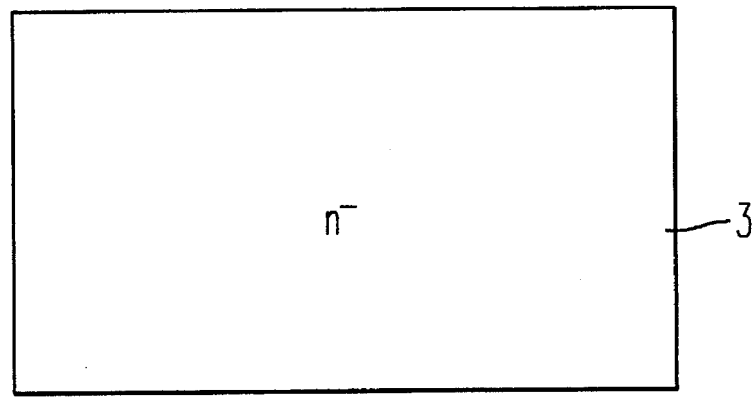
FIGS. 16A to 16C are cross sectional views showing the device of the fourth preferred embodiment during successive stages of fabrication.
Figure 16B:
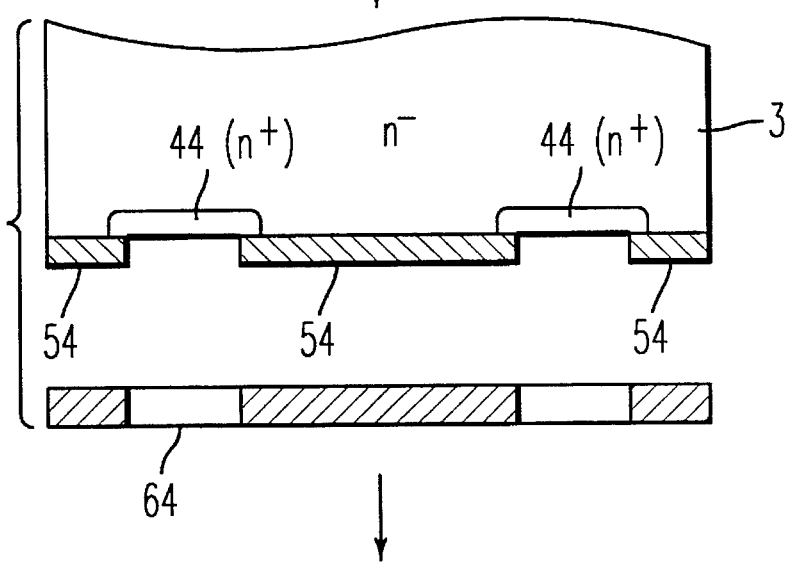
Figure 16C:
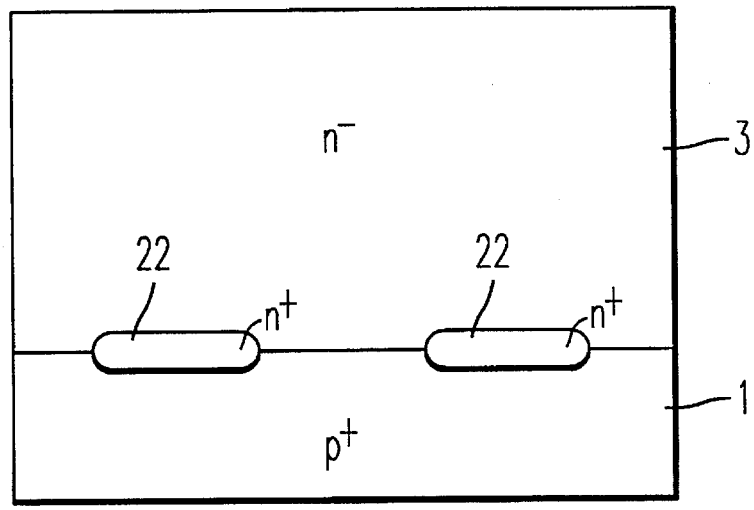

FIGS. 16A to 16C are cross sectional views showing the device of the fourth preferred embodiment (FIG. 6) during successive stages of fabrication. It is to be noted that FIGS. 16A to 16C illustrate the device upside down to as it regularly is during fabrication so as to be in conformity with FIG. 6 which shows a cross section of the finished device. First, an n-type silicon substrate which corresponds to the n-type semiconductor layer 3 is prepared (FIG. 16A). Next, the n-type semiconductor layer 3 is covered at the entire bottom major surface with a resist layer from which a resist pattern 54 (shielding film) will be subsequently formed by a photolithography process through a mask 64. Following this, n-type impurities such as As are selectively implanted through the resist pattern 54, thereby defining an n-type semiconductor region 44 in the bottom surface of the n-type semiconductor layer 3 (FIG. 16B). The resist pattern 54 is then removed, and the p-type semiconductor layer 1 is epitaxially grown on the bottom major surface of the n-type semiconductor layer 3. During this step, the n-type impurities of the n-type semiconductor region 44 diffuse, whereby the heavily doped n-type semiconductor region 22 is formed between the n-type semiconductor layer 3 and the p-type semiconductor layer 1 (FIG. 16C). The device shown in FIG. 6 will be hereinafter completed by procedures similar to those used to fabricate the device of the first preferred embodiment.

The reason why the semiconductor substrate which corresponds to the n-type semiconductor layer 3 is prepared first instead of forming the p-type semiconductor layer 1 as in the preceding methods is because the n-type semiconductor layer 3 must be sufficiently thick to manufacture the device of the fourth preferred embodiment. In other words, formation of the n-type semiconductor layer 3 by expensive epitaxial growth contradicts economies in production. Of course, if economics in production is not an important consideration, the p-type semiconductor layer 1 may be prepared first and the n-type semiconductor layer 3 may be formed by epitaxial growth to manufacture the device shown in FIG. 6.

<<Manufacturing Process of Fifth Preferred Embodiment>>

Fabrication of the device of the fifth preferred embodiment is similar to that explained as the sixth preferred embodiment up to formation of the heavily doped n-type semiconductor region 22. The procedures that follow are similar to procedures conventionally used in fabrication of a U-type IGBT.

<<Other Example of Manufacturing Process of First Preferred Embodiment>>

The devices according to the first to the third and the fifth preferred embodiments are also obtainable by preparing the n-type semiconductor layer 3 first instead of the p-type semiconductor layer 1, which is similar to the manufacturing process of the fourth preferred embodiment. In the following such a manufacturing method will be described.

Figure 17A:
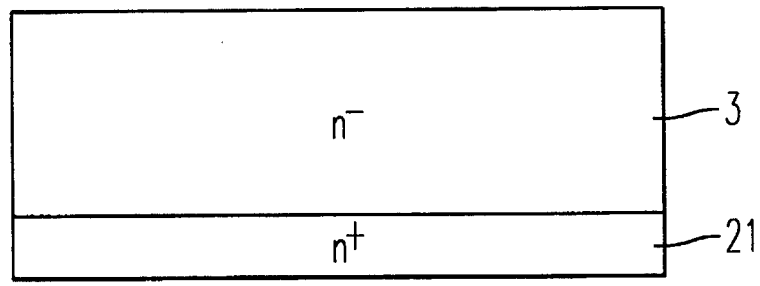
FIGS. 17A to 17C are cross sectional views showing the device of the first preferred embodiment during successive stages of other type of fabrication.
Figure 17B:
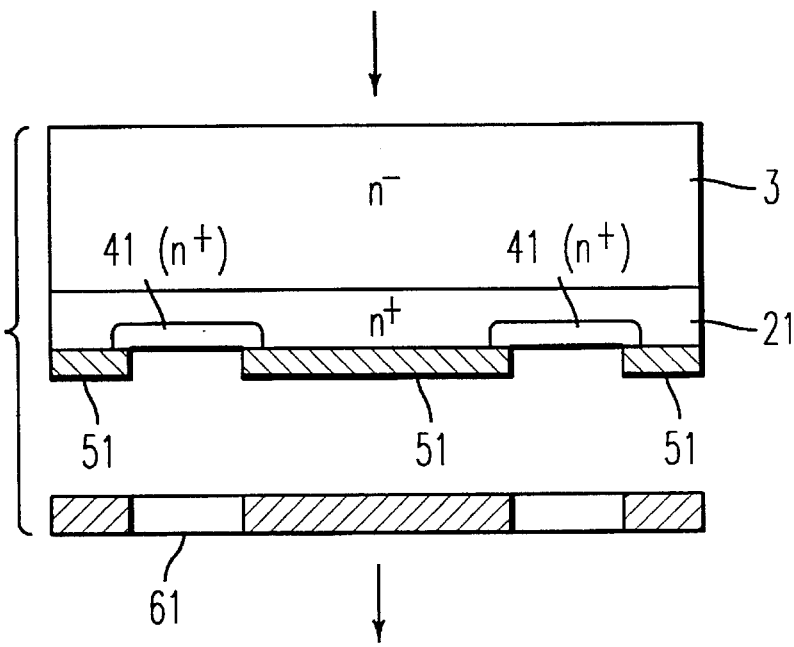
Figure 17C:
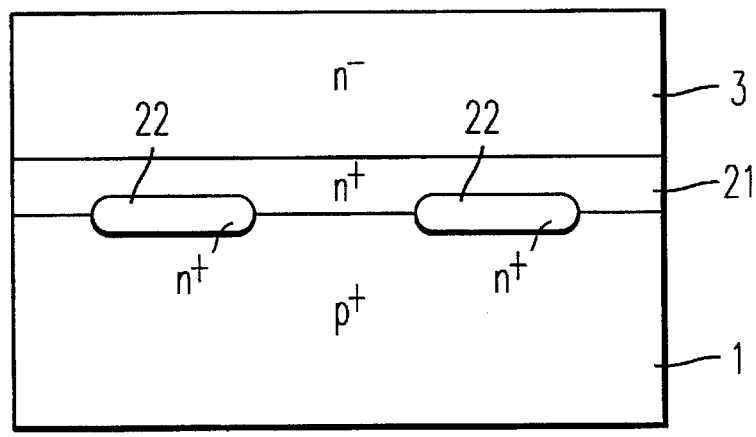

FIGS. 17A to 17C are views showing the device of the first preferred embodiment (FIG. 1) during successive stages of other type of fabrication. Like FIGS. 16A to 16C, FIGS. 17A to 17C illustrate the device upside down to as it regularly is during fabrication so as to be in conformity with FIG. 1 which shows a cross section of the finished device. For the sake of convenience, FIGS. 17A to 17C will be referred to here. This is also the same regarding FIGS. 18A to 18C and FIGS. 19A to 19C.

In this method, an n-type silicon substrate which corresponds to the n-type semiconductor layer 3 is prepared first. Next, on a bottom major surface of the n-type semiconductor layer 3, the buffer layer 21 is epitaxially grown. The buffer layer 21 is formed so as to be sufficiently thicker than the heavily doped n-type semiconductor region 22 described later (FIG. 17A).

Following this, a resist layer is formed all over a bottom major surface of the buffer layer 21 and photolithography patterned using the mask 61, thereby defining the resist pattern 51 (shielding film). Through the resist pattern 51, n-type impurities such as As are selectively injected so that the n-type semiconductor region 41 is selectively formed in the bottom major surface of the buffer layer 21 (FIG. 17B).

Next, the resist pattern 51 is removed and the p-type semiconductor layer 1 is epitaxially grown on bottom major surface of the buffer layer 21. During this epitaxial growth, the n-type impurities diffuse from the n-type semiconductor region 41, whereby the heavily doped n-type semiconductor region 22 is formed between the p-type semiconductor layer 1 and the fubber layer 21 (FIG. 17C). By hereinafter performing the manufacturing process of the first preferred embodiment, the device shown in FIG. 1 is completed.

While the impurity concentration of the n-type impurities in the n-type semiconductor layer 3 needs be accurately adjusted, the impurity concentration of the p-type impurities in the p-type semiconductor layer 1 may not be adjusted very accurately. In the method of this embodiment, the n-type semiconductor layer 3 which requires relatively accurate adjustment is prepared in advance as a substrate and the p-type semiconductor layer 1 which does not require very accurate adjustment is epitaxially grown, and therefore, it is easy to correctly adjust the impurity concentration of the n-type impurities in the n-type semiconductor layer 3. In addition, the p-type semiconductor layer 1 is formed easily.

<<Other Example of Manufacturing Process of Second Preferred Embodiment>>

Figure 18A:
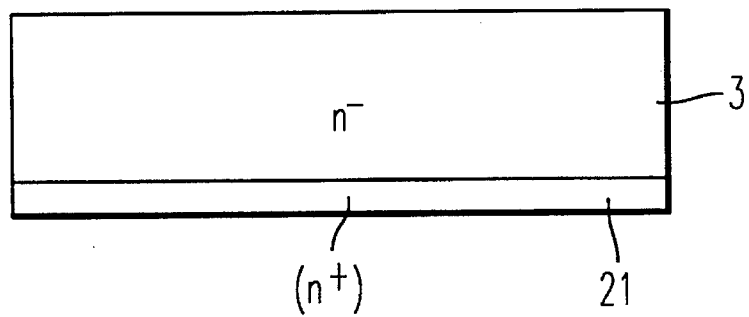
FIGS. 18A to 18C are cross sectional views showing the device of the second preferred embodiment during successive stages of other type of fabrication.
Figure 18B:
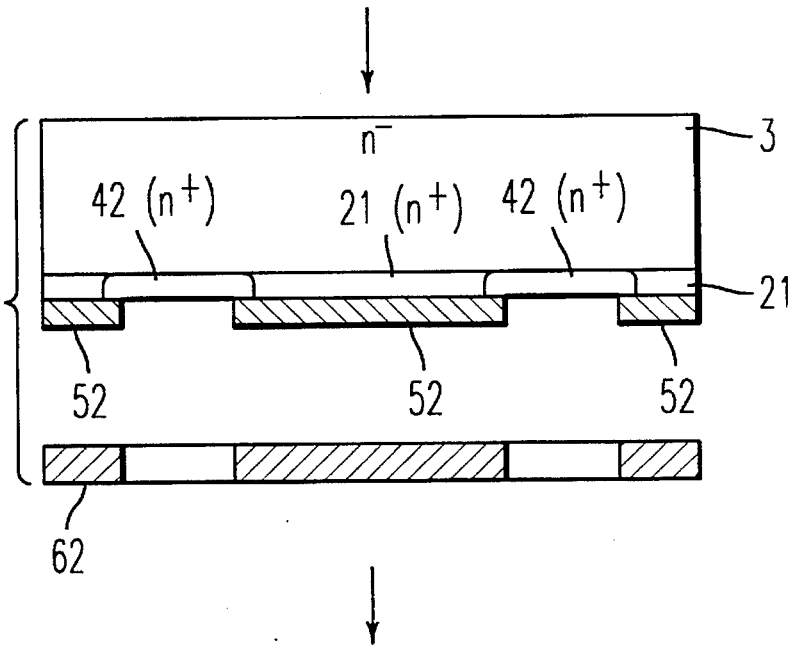
Figure 18C:
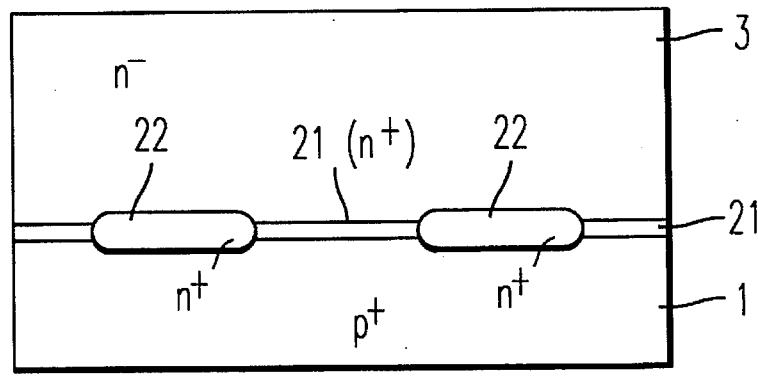

FIG. 18A to 18C are views showing the device of the second preferred embodiment (FIG. 4) during successive stages of other type of fabrication. In this manufacturing method, first, an n-type silicon substrate which corresponds to the n-type semiconductor layer 3 is prepared. Next, on a bottom major surface of the n-type semiconductor layer 3, the buffer layer 21 is epitaxially grown. The buffer layer 21 is formed so as to be thinner than the heavily doped n-type semiconductor region 22 described later (FIG. 18A).

Next, a resist layer is formed all over a bottom major surface of the buffer layer 21 and photolithography patterned using the mask 62, thereby defining the resist pattern 52 (shielding film). Through the resist pattern 52, n-type impurities such as As are selectively injected so that the n-type semiconductor region 42 is selectively formed in the bottom major surface of the buffer layer 21 (FIG. 18B).

Following this, the resist pattern 52 is removed and the p-type semiconductor layer 1 is epitaxially grown on bottom major surface of the buffer layer 21. During this epitaxial growth, the n-type impurities diffuse from the n-type semiconductor region 42, whereby the heavily doped n-type semiconductor region 22 is formed between the p-type semiconductor layer 1 and the lubber layer 21 (FIG. 18C). By hereinafter performing the manufacturing process of the first preferred embodiment, the device shown in FIG. 4 is fabricated.

In the method according to this embodiment, too, the n-type semiconductor layer 3 which requires relatively accurate adjustment is prepared in advance as a substrate and the p-type semiconductor layer 1 which does not require very accurate adjustment is epitaxially grown, and therefore, it is easy to correctly adjust the impurity concentration of the n-type impurities in the n-type semiconductor layer 3 and to form the p-type semiconductor layer 1.

<<Other Example of Manufacturing Process of Third Preferred Embodiment>>

Figure 19A:
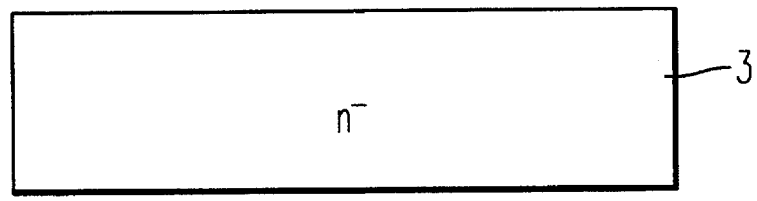
FIGS. 19A to 19C are cross sectional views showing the device of the third preferred embodiment during successive stages of other type of fabrication.
Figure 19B:
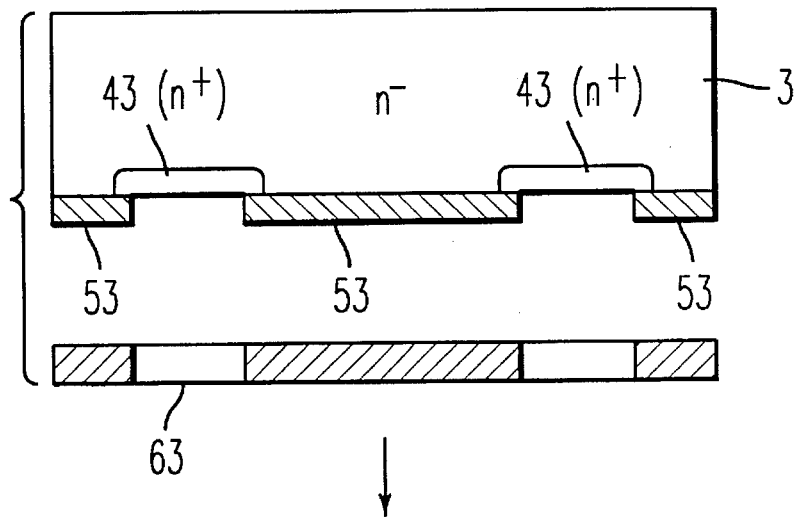
Figure 19C:
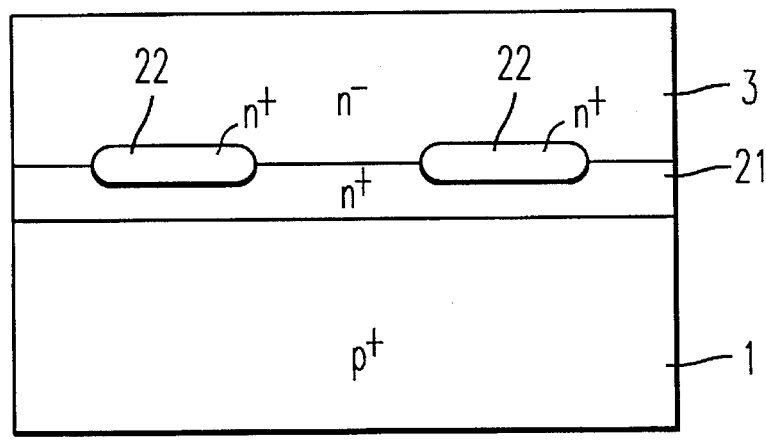

FIG. 19A to 19C are views showing the device of the third preferred embodiment (FIG. 5) during successive stages of other type of fabrication. In this manufacturing method, first, an n-type silicon substrate which corresponds to the n-type semiconductor layer 3 is prepared (FIG. 19A). Next, a resist layer is grown on the entire bottom major surface of the n-type semiconductor layer 3 and photolithography patterned using the mask 63, thereby defining the resist pattern 53 (shielding film). Through the resist pattern 53, n-type impurities such as As are selectively injected so that the n-type semiconductor region 43 is selectively formed in the bottom major surface of the n-type semiconductor layer 3 (FIG. 19B).

Next, the buffer layer 21 is epitaxially grown on the bottom major surface of the n-type semiconductor layer 3. During this epitaxial growth, the n-type impurities diffuse from the n-type semiconductor region 43, whereby the heavily doped n-type semiconductor region 22 is formed between the buffer layer 21 and the n-type semiconductor layer 3. The buffer layer 21 is formed so as to be sufficiently thick so that the heavily doped n-type semiconductor region 22 will not extend to the bottom major surface of the buffer layer 21.

Further, the p-type semiconductor layer 1 is epitaxially grown on the bottom major surface of the buffer layer 21 (FIG. 19C). By hereinafter performing the manufacturing process of the first preferred embodiment, the device shown in FIG. 5 is obtained.

In the method according to this embodiment, too, the n-type semiconductor layer 3 which requires relatively accurate adjustment is prepared in advance as a substrate and the p-type semiconductor layer 1 which does not require very accurate adjustment is epitaxially grown, and therefore, it is easy to correctly adjust the impurity concentration of the n-type impurities in the n-type semiconductor layer 3 and to form the p-type semiconductor layer 1.

<<Other Example of Manufacturing Process of Fifth Preferred Embodiment>>

Other manufacturing method of the device of the fifth preferred embodiment (FIG. 7) is similar to the processes (FIGS. 17A to 17C) of the fourteenth preferred embodiment up to formation of the heavily doped n-type semiconductor region 22. The subsequent processes are the same as conventional processes for fabrication of an U-type IGBT.

In the method according to this embodiment, too, the n-type semiconductor layer 3 which requires relatively accurate adjustment is prepared in advance as a substrate and the p-type semiconductor layer 1 which does not require very accurate adjustment is epitaxially grown, and therefore, it is easy to correctly adjust the impurity concentration of the n-type impurities in the n-type semiconductor layer 3 and to form the p-type semiconductor layer 1.

<<Other Preferred Embodiments>>

The present invention is also applicable to a p-channel IGBT in which the semiconductor layers of alternate conductivity are disposed in an opposite manner to that of an n-channel IGBT.

The present invention can be applied to other types of insulated gate semiconductor devices such as ESTs and MCTs.

While the invention has been described in detail, the foregoing description is in all aspects illustrative and not restrictive. It is understood that numerous other modifications and variations can be devised without departing from the scope of the invention.

I claim:

1. An insulated gate semiconductor device, comprising:
   a first semiconductor region of a first conductivity type;
   a second semiconductor region of a second conductivity type formed on said first semiconductor region;

a third semiconductor region of the first conductivity type selectively formed in a top portion of said second semiconductor region;

a fourth semiconductor region of the second conductivity type selectively formed in a top portion of said third semiconductor region;

a fifth semiconductor region of the second conductivity type selectively formed in a bottom portion of said second semiconductor region being formed in the shape of flat stripes and having a higher concentration of impurities of the second type than said second semiconductor region;

an insulating layer formed on said third and said fourth semiconductor regions;

a first main electrode electrically connected to said first semiconductor region;

a second main electrode electrically connected to said fourth semiconductor region; and a control electrode formed on said insulating layer;

wherein said third semiconductor region comprises first and second portions laterally separated from each other, a trench is formed in a top portion of said second semiconductor region located between said first and second portions of said third semiconductor region, said insulating layer is formed on an inside wall of said trench, and said control electrode layer substantially covers said insulating layer in said trench.

2. An insulated gate semiconductor device, comprising:

a first semiconductor region of a first conductivity type;

a second semiconductor region of a second conductivity type formed on said first semiconductor region;

a third semiconductor region of the first conductivity type selectively formed in a top portion of said second semiconductor region;

a fourth semiconductor region of the second conductivity type selectively formed in a top portion of said third semiconductor region;

a fifth semiconductor region of the second conductivity type selectively formed in a bottom portion of said second semiconductor region and having a higher concentration of impurities of the second type than said second semiconductor region;

an insulating layer formed on said third and said fourth semiconductor regions;

a first main electrode electrically connected to said first semiconductor region;

a second main electrode electrically connected to said fourth semiconductor region; and a control electrode formed on said insulating layer;

wherein said fifth semiconductor region comprises a plurality of regions spaced at a predetermined distance, and said fifth semiconductor region is formed in the shape of flat island regions isolated from each other and arranged in a matrix configuration.

3. An insulated gate semiconductor device, comprising:

a first semiconductor region of a first conductivity type;

a second semiconductor region of a second conductivity type formed on said first semiconductor region;

a third semiconductor region of the first conductivity type selectively formed in a top portion of said second semiconductor region;

a fourth semiconductor region of the second conductivity type selectively formed in a top portion of said third semiconductor region;

a fifth semiconductor region of the second conductivity type selectively formed in a bottom portion of said second semiconductor region and having a higher concentration of impurities of the second type than said second semiconductor region;

an insulating layer formed on said third and said fourth semiconductor regions;

a first main electrode electrically connected to said first semiconductor region;

a second main electrode electrically connected to said fourth semiconductor region; and a control electrode formed on said insulating layer;

wherein said fifth semiconductor region comprises a plurality of regions spaced at a predetermined distance, said fifth semiconductor region is formed in the shape of flat parallel stripes, and said third semiconductor region is formed in the shape of stripes along the top portion of said second semiconductor region, and a plurality of said fifth semiconductor regions are disposed for and parallel to each third semiconductor region.

4. The insulated gate semiconductor device of claim 3, comprising:

said device having a plurality of unit cells, each of said unit cells having at least one of said third semiconductor regions; and a plurality of entire ones of said fifth semiconductor regions are disposed for each of said third semiconductor regions in each of said unit cells.

5. An insulated gate semiconductor device, comprising:

a first semiconductor region of a first conductivity type;

a second semiconductor region of a second conductivity type formed on said first semiconductor region;

a third semiconductor region of the first conductivity type selectively formed in a top portion of said second semiconductor region;

a fourth semiconductor region of the second conductivity type selectively formed in a top portion of said third semiconductor region;

a fifth semiconductor region of the second conductivity type selectively formed in a bottom portion of said second semiconductor region and having a higher concentration of impurities of the second type than said second semiconductor region;

an insulating layer formed on said third and said fourth semiconductor regions;

a first main electrode electrically connected to said first semiconductor region;

a second main electrode electrically connected to said fourth semiconductor region; and a control electrode formed on said insulating layer;

wherein said fifth semiconductor region is formed in the shape of flat cross stripes having flat parallel first stripes and flat parallel second stripes disposed substantially perpendicular to said first stripes, and said third semiconductor region is formed in the shape of stripes along the top portion of said second semiconductor region, and a plurality of said first stripes are disposed for and parallel to each third semiconductor region.

6. An insulated gate semiconductor device, comprising:

a first semiconductor region of a first conductivity type;

a second semiconductor region of a second conductivity type formed on said first semiconductor region;

a third semiconductor region of the first conductivity type selectively formed in a top portion of said second semiconductor region;

a fourth semiconductor region of the second conductivity type selectively formed in a top portion of said third semiconductor region;

a fifth semiconductor region of the second conductivity type selectively formed in a bottom portion of said second semiconductor region and having a higher concentration of impurities of the second type than said second semiconductor region;

an insulating layer formed on said third and said fourth semiconductor regions;

a first main electrode electrically connected to said first semiconductor region;

a second main electrode electrically connected to said fourth semiconductor region; and a control electrode formed on said insulating layer;

wherein said fifth semiconductor region is formed in the shape of flat cross stripes;

wherein said flat cross stripes comprise:

flat parallel first stripes arranged parallel to said third semiconductor regions; and flat parallel second stripes arranged perpendicular to said first stripes;

wherein a plurality of said first parallel flat stripes are disposed for each of said third semiconductor regions; and wherein said device has a plurality of unit cells, each of said unit cells having at least one of said third semiconductor regions; and a plurality of entire ones of said first parallel flat stripes are disposed for each of said third semiconductor regions in each of said unit cells.

7. The insulated gate semiconductor device of claim 1, wherein said second semiconductor region comprises:

a first semiconductor portion formed on the top major surface of said first semiconductor region and having a concentration of impurities of the second conductivity type which is lower than that of said fifth semiconductor region; and a second semiconductor portion formed on a top major surface of said first semiconductor portion and having a concentration of impurities of the second conductivity type which is lower than that of said first semiconductor portion.

8. The insulated gate semiconductor device of claim 7, wherein the concentration of impurities of said second semiconductor portion is substantially equal to or less than $5\times10^{14}$ cm$^{-3}$, the concentration of impurities of said first semiconductor portion is selected from the range substantially defined from $5\times10^{14}$ cm$^{-3}$ to $10^{17}$ cm$^{-3}$, and the concentration of impurities of said fifth semiconductor region is selected from the range substantially defined from $10^{18}$ cm$^{-3}$ to $10^{21}$ cm$^{-3}$.

9. The insulated gate semiconductor device of claim 8, wherein the concentration of impurities of said fifth semiconductor region is substantially equal to or more than one hundred times that of said first semiconductor portion.

10. The insulated gate semiconductor device of claim 7, wherein said fifth semiconductor region is located in an interface of said first semiconductor portion of said second semiconductor regions and said first semiconductor region.

11. The insulated gate semiconductor device of claim 7, wherein said fifth semiconductor region extends from a bottom portion of said second semiconductor portion to said first semiconductor region through said first semiconductor portion.

12. The insulated gate semiconductor device of claim 7, wherein said fifth semiconductor region is located in an interface of said first and second semiconductor portions of said second semiconductor portions.

13. The insulated gate semiconductor device of claim 3, wherein said third semiconductor region comprises first and second portions laterally separated from each other, a trench is formed in a top portion of said semiconductor body located between said first and second portions of said third semiconductor region, said insulating layer is formed on an inside wall of said trench, and said control electrode layer substantially covers said insulating layer in said trench.

14. The insulated gate semiconductor device of claim 1, wherein said fifth semiconductor region is arranged in a matrix configuration.

15. The insulated gate semiconductor device of claim 1, wherein said fifth semiconductor region is formed in the shape of cross stripes.

16. The insulated gate semiconductor device of claim 3, wherein said second semiconductor region comprises:

a first semiconductor portion formed on a top major surface of said first semiconductor region and having a concentration of impurities of the second conductivity type which is lower than that of said fifth semiconductor region; and a second semiconductor portion formed on a top major surface of said first semiconductor portion and having a concentration of impurties of the second conductivity type which is lower than that of said semiconductor portion.

\* \* \* \* \*